United States Patent
McCombs, Jr.

(10) Patent No.: US 12,249,400 B2
(45) Date of Patent: Mar. 11, 2025

(54) DYNAMIC WAY-BASED VARIABLE PIPELINE ARCHITECTURE FOR ON-CHIP MEMORY

(71) Applicant: Arm Limited, Cambridge (GB)

(72) Inventor: Edward Martin McCombs, Jr., Austin, TX (US)

(73) Assignee: Arm Limited, Cambridge (GB)

( * ) Notice: Subject to any disclaimer, the term of this patent is extended or adjusted under 35 U.S.C. 154(b) by 237 days.

(21) Appl. No.: 17/885,747

(22) Filed: Aug. 11, 2022

(65) Prior Publication Data

US 2024/0055034 A1    Feb. 15, 2024

(51) Int. Cl.
| | | |
|---|---|---|
| G11C 16/04 | (2006.01) | |
| G11C 7/10 | (2006.01) | |
| G11C 8/08 | (2006.01) | |
| G11C 8/18 | (2006.01) | |

(52) U.S. Cl.
CPC .................. *G11C 8/08* (2013.01); *G11C 7/10* (2013.01); *G11C 8/18* (2013.01)

(58) Field of Classification Search
CPC ................ G11C 8/08; G11C 7/10; G11C 8/18
See application file for complete search history.

(56) References Cited

U.S. PATENT DOCUMENTS

| | | |
|---|---|---|
| 6,628,566 B2 | 9/2003 | Jeong |
| 2007/0153584 A1 | 7/2007 | Mohammad et al. |
| 2010/0128550 A1 | 5/2010 | Lovett |
| 2017/0357597 A1 | 12/2017 | Tune |
| 2022/0113892 A1* | 4/2022 | Fugazza ................. H10B 63/84 |
| 2023/0343384 A1* | 10/2023 | Husain ............... G11C 13/0026 |
| 2024/0054073 A1 | 2/2024 | Tune et al. |
| 2024/0055035 A1 | 2/2024 | Mccombs, Jr. |
| 2024/0055047 A1 | 2/2024 | Mccombs, Jr. et al. |

OTHER PUBLICATIONS

U.S. Appl. No. 17/885,753, filed Aug. 11, 2022, McCombs Jr.*
Salvador Petit, Julio Sahuquillo, Jose M. Such, and David Kaeli. May 4-6, 2005. Exploiting temporal locality in drowsy cache policies. In Proceedings of the 2nd conference on Computing frontiers (CF '05). Association for Computing Machinery, New York, NY, USA, 371-377. https://doi.org/10.1145/1062261.1062321.

(Continued)

*Primary Examiner* — Pho M Luu
(74) *Attorney, Agent, or Firm* — Leveque Intellectual Property Law, P.C.

(57) ABSTRACT

An on-chip memory is provided. The memory includes wordline sections, input/output (I/O) circuitry, and control circuitry. Each wordline section includes a number of wordlines, and each wordline section is coupled to a different wordline control circuitry. The control circuitry is configured to, in response to receiving an access request including an address, decode the address including determine, based on the address, an associated wordline, and determine, based on the associated wordline, an associated wordline section. The control circuitry is further configured to apply power to wordline control circuitry coupled to the associated wordline section, and access the address.

20 Claims, 18 Drawing Sheets

(56) References Cited

OTHER PUBLICATIONS

The Hell of Caches; Rodgers et al.: Oct. 13-16, 2010; retrieved from https://web.archive.org/web/20101013063833/http://www.cs.umd.edu/~meesh/cmsc411/website/projects/out/hoc/cache.htm on Sep. 29, 2023 (Year: 2010).

Nakamura et al., "A 500-MHz 4-Mb CMOS pipeline-burst cache SRAM with point-to-point noise reduction coding I/O," IEEE Journal of Solid-State Circuits, vol. 32, No. 11, pp. 1758-1765, Nov. 1997 (DOI: 10.1109/4.641698).

Sato et al., "A 500-MHz pipelined burst SRAM with improved SER immunity," IEEE Journal of Solid-State Circuits, vol. 34, No. 11, pp. 1571-1579, Nov. 1999 (DOI: 10.1109/4.799865).

Augustine et al., "2X-Bandwidth Burst 6T-SRAM for Memory Bandwidth Limited Workloads", 20 IEEE Symposium on VLSI Circuits, Jun. 16-19, 2020 (DOI: 10.1109/VLSICircuits18222.2020).

\* cited by examiner

DYNAMIC WAY-BASED VARIABLE PIPELINE ARCHITECTURE FOR ON-CHIP MEMORY

BACKGROUND

The present disclosure relates to computer systems. More particularly, the present disclosure relates to memory.

Typical memory architectures incorporate a fixed pipeline in which the memory address is input, the memory cells are accessed and the data is read out. Some memory architectures attempt to improve memory access speed by anticipating the next memory address to be read. Unfortunately, these anticipation techniques are dependent on the current memory address and typically require multiple data buses or output buffers, one for the data read from the current memory address and one for the data read from the next memory address.

DETAILED DESCRIPTION

Figure 1:
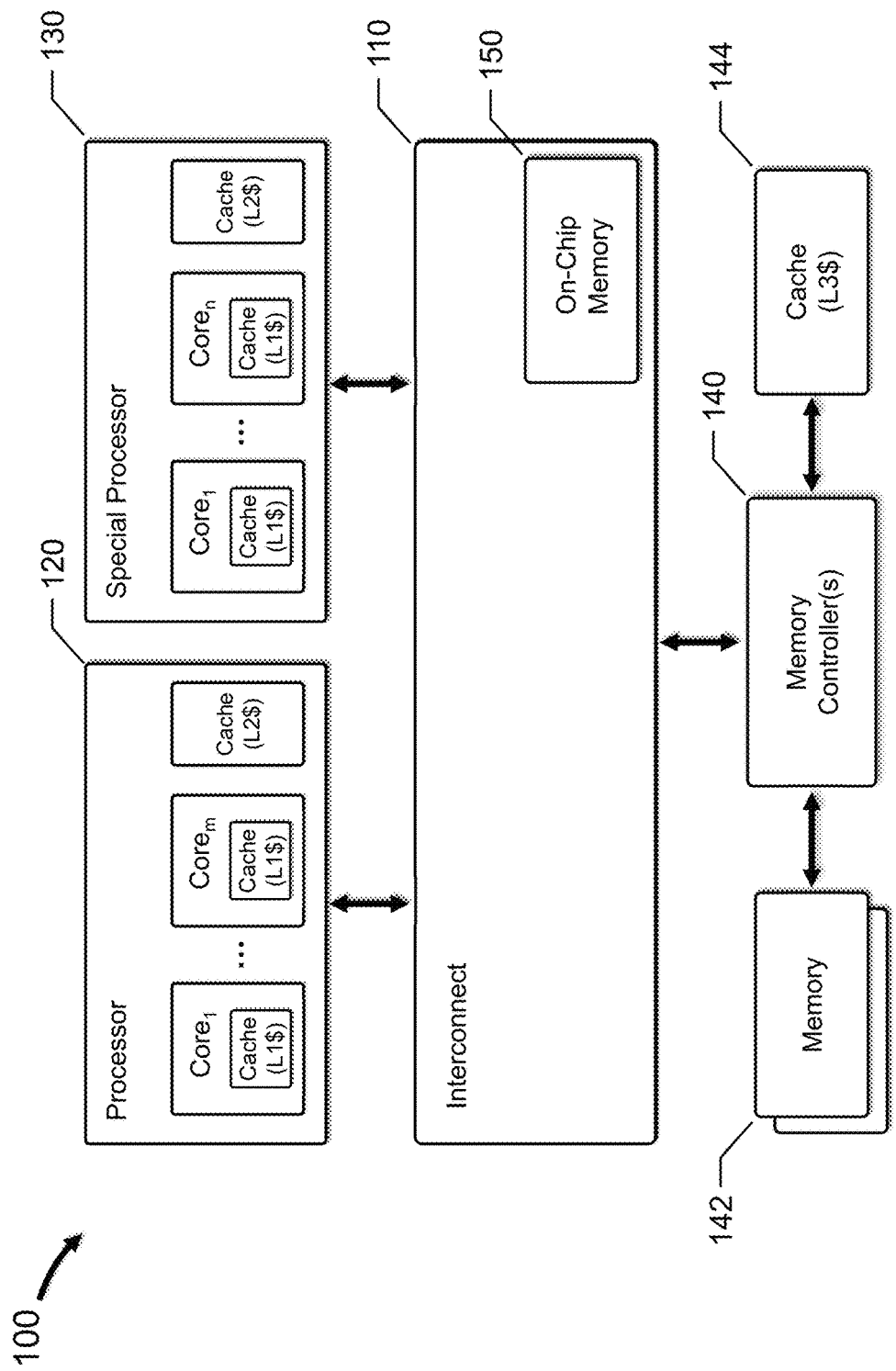
FIG. 1 depicts a block diagram of a system, in accordance with an embodiment of the present disclosure.

Embodiments of the present disclosure will now be described with reference to the drawing figures, in which like reference numerals refer to like parts throughout.

Embodiments of the present disclosure provide a dynamic, way-based variable pipeline architecture for on-chip memory, such as, for example, system cache memory, hierarchical cache memory, system memory, etc. Advantageously, embodiments of the present disclosure provide an independent pipeline that improves memory access speed without the drawbacks of anticipation techniques.

In one embodiment, a memory includes a plurality of wordline sections, each wordline section including a number of wordlines, and each wordline section coupled to a different wordline control circuitry; and control circuitry, coupled to the wordline control circuitry and I/O circuitry, configured to in response to receiving an access request including an address, decode the address, including determine, based on the address, an associated wordline, and determine, based on the associated wordline, an associated wordline section, apply power to wordline control circuitry coupled to the associated wordline section, and access the address.

FIG. 1 depicts a block diagram for SoC 100, in accordance with an embodiment of the present disclosure.

In this embodiment, SoC 100 includes interconnect 110 coupled to, inter alia, processor(s) 120, accelerator(s) or special processor(s) 130, and memory controller(s) 140 coupled to system memory 142 and last-level (or system level) cache 144. Other components may also be coupled to interconnect 110, such as, for example, network controllers and I/O interfaces, etc. In other embodiments, SoC 100 is a general purpose computer system, and interconnect 110 is a bus that transfers data between processor 120, special processor 130, memory controller 140, memory 142 and last-level cache 144, as well as other components.

Interconnect 110 is a communication system that transfers data between processor 120, special processor 130, memory controller 140, memory 142 and last level cache 144, as well as other components. Interconnect 110 may also include on-chip memory 150. Certain components of SoC 100 may be classified as a particular type of interconnect protocol node.

Generally, interconnect 110 may include, inter alia, a shared or hierarchical bus, a crossbar switch, a packet-based network-on-chip (NoC), etc. In one embodiment, interconnect 110 has a crossbar topology that provides an ordered network with low latency, and may be particularly suitable for a small-sized interconnect with a small number of protocol nodes, switches and wire counts. In another embodiment, interconnect 110 has a ring topology that balances wiring efficiency with latency, which increases linearly with the number of protocol nodes, and may be particularly suitable for a medium-sized interconnect. In a further embodiment, interconnect 110 has a mesh topology that has more wires to provide greater bandwidth, is modular and easily scalable by adding more rows and columns of switches or routers, and may be particularly suitable for a large-sized interconnect.

Generally, interconnect 110 may be a coherent or incoherent interconnect. In many embodiments, interconnect 110 is a coherent mesh network that includes multiple switches or router logic modules (routers) arranged in a two-dimensional rectangular mesh topology, such as, for example, the Arm CoreLink Coherent Mesh Network. In this example, the switches or routers are crosspoints (i.e., XPs). Each XP may connect up to four neighboring XPs using mesh ports, and may connect to one or two components (devices) using device ports. Additionally, each XP may support four coherent hub interface (CHI) channels to transport data from a source device to a destination or target device, as described, for example, in the Arm Advanced Microcontroller Bus Architecture (AMBA) CHI specification.

In these embodiments, interconnect 110 may have an architecture that includes three layers, i.e., an upper protocol layer, a middle network layer, and a lower link layer. The protocol layer generates and processes requests and responses at the protocol nodes, defines the permitted cache state transitions at the protocol nodes that include caches, defines the transaction flows for each request type, and manages the protocol level flow control. The network layer packetizes the protocol message, determines, and adds to the packet, the source and target node IDs required to route the packet over interconnect 110 to the required destination. The link layer provides flow control between components, and manages link channels to provide deadlock free switching across interconnect 110.

Processor 120 is a general-purpose, central processing unit (CPU) that executes instructions to perform various functions for SoC 100, such as, for example, control, computation, input/output, etc. More particularly, processor 120 may include a single processor core or multiple processor cores (or processing circuitries), which may be arranged in a processor cluster, such as, for example the Arm Cortex A, R and M families of processors. Each processor core may include a level 1 or L1 cache (L1$), and each processor 120 may include a level 2 or L2 cache (L2$) coupled to each processor core. Generally, processor 120 may execute computer programs or modules, such as an operating system, application software, other software modules, etc., stored within a memory, such as, for example, memory 142, etc.

Accelerator or special processor 130 is a specialized processor that is optimized to perform a specific function, such as process graphics, images and/or multimedia data, process digital signal data, process artificial neural network data, etc. For example, accelerator or special processor 130 may be a graphics processing unit (GPU), a digital signal processor (DSP), an image signal processor (ISP), a neural processing unit (NPU), etc. More particularly, accelerator or special processor 130 may include a single processor core or multiple processor cores (or processing circuitries), such as, for example the Arm Mali family of GPUs, display processors and video processors, the Arm Machine Learning processor, etc. Each processor core may include a level 1 or L1 cache (L1$), and each accelerator or special processor 130 may include a level 2 or L2 cache (L2$) coupled to each processor core.

Memory controller 140 may include a microprocessor, microcontroller, application specific integrated circuit (ASIC), field programmable gate array (FPGA), custom circuitry, programmable registers, etc., and is configured to provide access to memory 142 through interconnect 110. Memory 142 may include a variety of non transitory computer-readable medium that may be accessed by the other components of SoC 100, such as processor 120, accelerator or special processor 130, etc., and may be located on-chip or off-chip. For example, memory 142 may store data and instructions for execution by processor 120, accelerator or special processor 130, etc.

Generally, memory controller 140 and memory 142 provide storage for retrieving, presenting, modifying, and storing data. For example, memory 142 stores software modules that provide functionality when executed by processor 120, accelerator or special processor 130, etc. The software modules include an operating system that provides operating system functionality for SoC 100. Software modules provide various functionality, such as image classification, etc. Data may include data associated with the operating system, the software modules, etc.

In various embodiments, memory 142 may include volatile and nonvolatile medium, non-removable medium and/or removable medium. For example, memory may include any combination of random access memory (RAM), dynamic RAM (DRAM), double data rate (DDR) DRAM or synchronous DRAM (SDRAM), static RAM (SRAM), read only memory (ROM), HMC (Hybrid Memory Cube), HBM (High Bandwidth Memory), flash memory, cache memory, and/or any other type of non-transitory computer-readable medium. In certain embodiments, memory controller 140 is a dynamic memory controller that provides data transfers to and from high-density DDR3, DDR4 or DDR5 DRAM memory, such as, for example, the Arm CoreLink Dynamic Memory Controller (DMC) family, each of which includes a fast, single-port CHI channel interface for connecting to interconnect 110.

Last-level cache 144 includes high-speed SRAM, etc., and is typically known as a last-level, level 3 or L3 cache (L3$) that is provided between processor 120, special processor 130, etc., and memory 142.

On-chip memory 150 also includes high-speed SRAM, etc., and acts as a shared memory between processors 120, special processors 130 and peripherals to lessen memory bottleneck issues between data sources and processors.

As suggested above, the caches form a hierarchy, so when a processor core requires access to a data item, such as a processing instruction and/or data to be handled by the processing instruction, the processor core will first attempt to obtain or access that data item in the respective L1 cache. In the case of a cache miss, a search will be performed through the next closest cache levels, with an access to memory 142 performed only if the attempted cache accesses all miss. When the required data item is obtained from memory 142, a copy may be saved in one or more caches.

In general terms, the L1 cache is normally implemented proximate to the respective processor core to provide rapid, low latency and potentially energy efficient access to data stored by that L1 cache. The L2 cache is implemented to be further away from the respective processor core, and may be larger than the L1 cache. The L3 cache is implemented to be further still from the respective processor core, but is closest, in the hierarchy, to memory 142 and is much larger than the L2 cache. In the embodiment depicted in FIG. 1, processor 120 and special processor 130 have multiple processor cores, and each processor core has a respective L1 cache. In other embodiments, one or more L1 caches (L1$s) may be shared between processing cores. Processor 120 and special processor 130 also have an L2 cache (L2$) that is shared between the processor cores.

Last-level cache 144 provides the last level of cache (L3$) between processor 120 and special processor 130 and memory 142. Generally, accessing data from a cache not only reduces latency but also reduces access power consumption when compared to accessing the same data from memory 142.

Rather than a last level cache, on-chip memory 150 provides a scratch pad memory for any processor or peripheral that connects to SoC 100. The address space for on-chip memory 150 lies is a region of the address space of SoC 100 that is separate from the address space of memory 142 and memory-mapped I/O, such as peripherals. In certain embodiments, on-chip memory 150 may be a system cache.

Generally, accessing data from a cache not only reduces latency but also reduces access power consumption when compared to accessing the same data from memory 142.

Additionally, the caches may operate under an inclusive or exclusive cache policy. An inclusive cache policy ensures that data stored in a particular cache is also stored in any lower level caches. For example, a value in an L1 cache would also be present in the respective L2 cache and final L3 cache. On the other hand, an exclusive cache policy ensures that data are only stored in one level of the cache. For example, a value in an L1 cache would not be present in the respective L2 cache and final L3 cache.

SoC 100 may also include I/O interface(s) (not depicted), coupled to interconnect 110, that are configured to transmit and/or receive data from I/O devices. The I/O interfaces enable connectivity between processor 120, special processor 130, etc. and the I/O devices by encoding data to be sent to the I/O devices, and decoding data received from the I/O devices. Generally, data may be sent over wired and/or wireless connections. For example, the I/O interfaces may include one or more wired communications interfaces, such as PCIe, USB, etc., and/or one or more wireless communications interfaces, coupled to one or more antennas, such as WiFi, Bluetooth, cellular, etc.

Generally, the I/O devices provide input to SoC 100 and/or output from SoC 100. As discussed above, the I/O devices are operably connected to the I/O controller using a wired and/or wireless connection. The I/O devices may include a local processor coupled to a communication interface that is configured to communicate with SoC 100 using the wired and/or wireless connection. For example, the I/O devices may include a keyboard, mouse, touch pad, joystick, etc.

SoC 100 may also include network interface(s) configured to transmit data to and from one or more networks using one or more wired and/or wireless connections. The networks may include one or more local area networks, wide area networks, the Internet, etc., which may execute various network protocols, such as, for example, wired and/or wireless Ethernet, Bluetooth, etc. The networks may also include various combinations of wired and/or wireless physical layers, such as, for example, copper wire or coaxial cable networks, fiber optic networks, Bluetooth wireless networks, WiFi wireless networks, CDMA, FDMA and TDMA cellular wireless networks, etc.

Figure 2A:
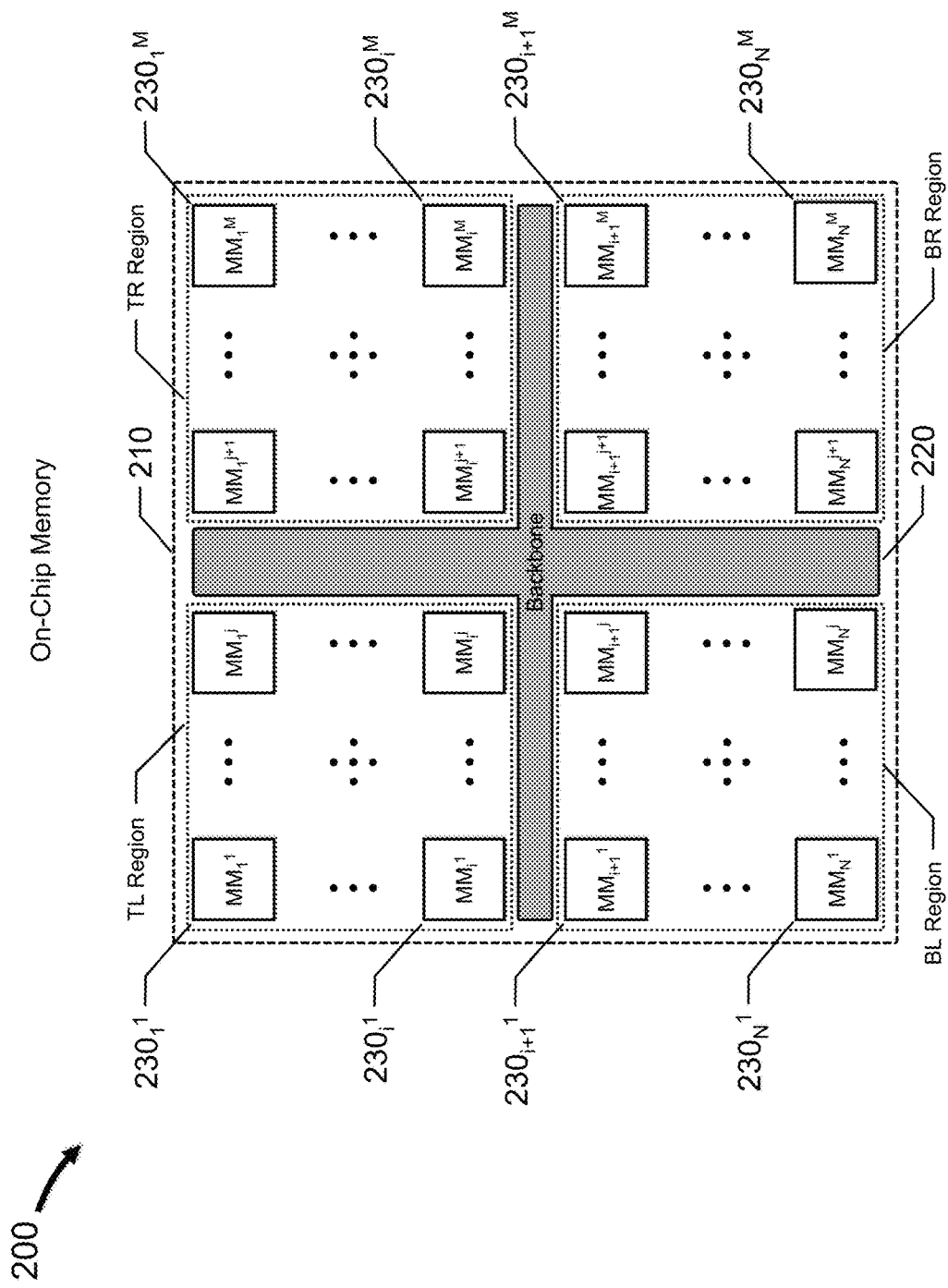
FIGS. 2A and 2B depict block diagrams of an on-chip memory, in accordance with embodiments of the present disclosure.
Figure 2B:
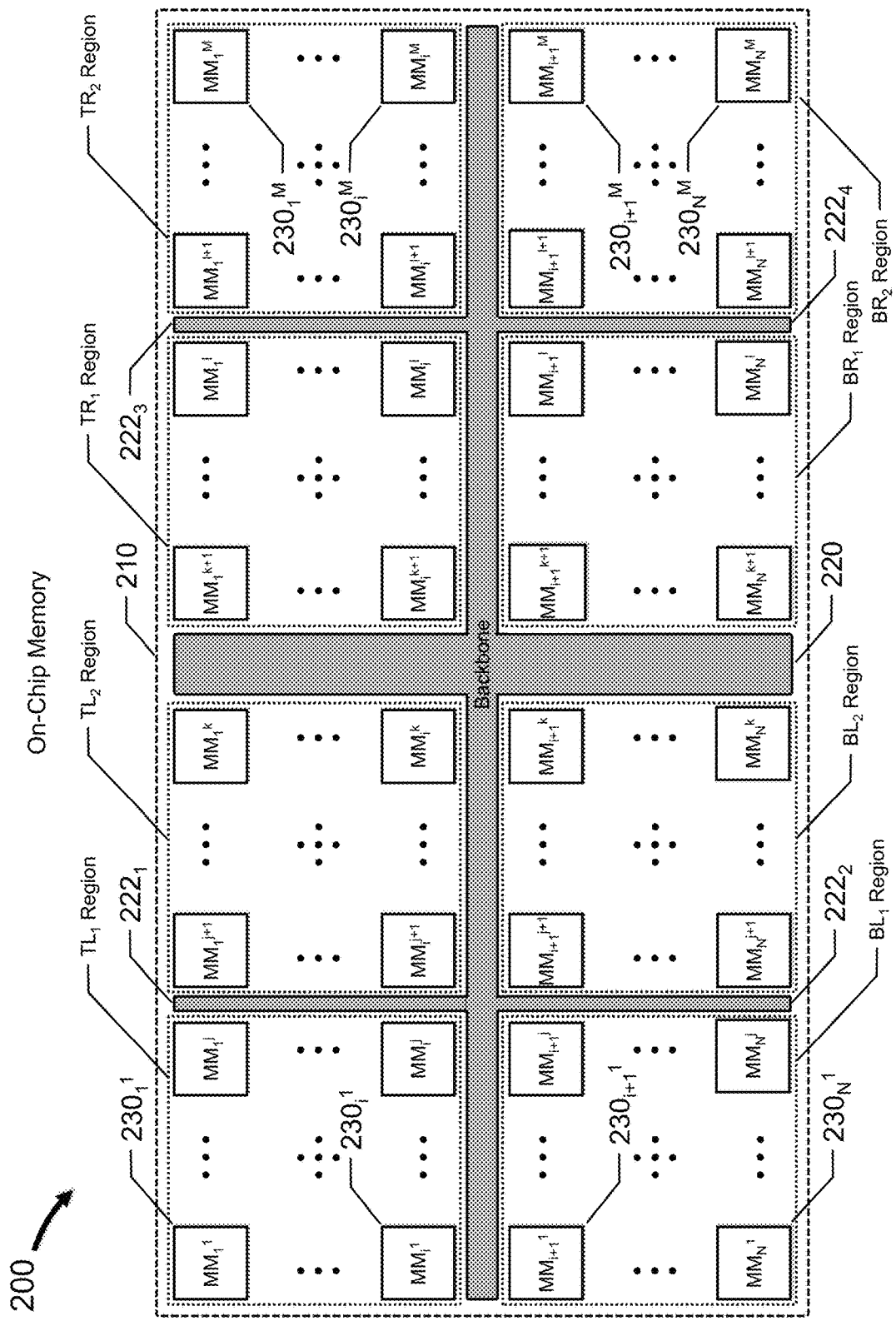

FIGS. 2A and 2B depict block diagrams of on-chip memory 200, in accordance with embodiments of the present disclosure. Memory 200 will be described with respect to system cache memory; other embodiments are also supported, such as, hierarchical cache memory, system memory, etc. These embodiments are applicable not only to physical memory but also to compiled instances, etc.

With respect to FIG. 2A, memory 200 includes, inter alia, an array 210 including backbone 220, memory modules (MMs) 230, as well as other components not depicted for clarity. Generally, array 210 has a width in a lateral direction, and a height in a longitudinal direction. Backbone 220 is a data, address and control signal bus that includes a primary portion and a number of secondary portions that generally divide array 210 into regions.

In many embodiments, the primary portion of backbone 220 is disposed in the lateral center of array 210 and extends in the longitudinal direction from the lower edge to the upper edge of array 210 (i.e., approximately the height of array 210), a first secondary portion of backbone 220 is disposed in the longitudinal center of array 210 and extends in a first lateral direction from the primary portion of backbone 220 to a left edge of array 210 (i.e., approximately 50% of the width of array 210), and a second secondary portion of backbone 220 is disposed in the longitudinal center of array 210 and extends in a second lateral direction from the primary portion of backbone 220 to a right edge of array 210 (i.e., approximately 50% of the width of array 210). The primary and secondary portions of backbone 220 divide array 210 into four regions, which, for convenience, are referred to as the top left (TL) region, the top right (TR) region, the bottom left (BL) region and the bottom right (BR) region.

In this embodiment, array 210 includes a total number of memory modules 230, arranged in rows and columns, and, more particularly, arranged into four regions, i.e., TL, BL, TR and BR. Each region is bordered by backbone 220 (on two sides), and includes an equal number of memory modules 230 (i.e., 25% of the total number of memory modules 230) that are serviced by backbone 220.

Various numbers and arrangements of memory modules 230 are supported, such as, for example, 16 memory modules 230 arranged into 4 regions (i.e., 4 memory modules 230 per region), 32 memory modules 230 arranged into 4 regions (i.e., 8 memory modules 230 per region), 64 memory modules 230 arranged into 4 regions (i.e., 16 memory modules 230 per region), 128 memory modules 230 arranged into 4 regions (i.e., 32 memory modules 230 per region), etc.

Generally, each region includes "i" rows and "j" columns of memory modules 230. In many embodiments, "i" and "j" are the same (e.g., 2, 4, etc.), while in other embodiments, "i" and "j" may be different (e.g., "i" equals 2 and "j" equals 4, etc.).

The TL region includes a first row, i.e., memory module $230_1^{\,1}$ ($MM_1^{\,1}$), $MM_1^{\,j}$, (i-2) intermediate rows, and a last row, i.e., memory module $230_i^{\,1}$ ($MM_i^{\,1}$), ..., $MM_i^{\,j}$. The TL region also includes a first column, i.e., $MM_1^{\,1}$, ..., $MM_i^{\,1}$, (j-2) intermediate columns, and a last column, i.e., $MM_1^{\,j}$, ..., $MM_i^{\,j}$.

The BL region includes a first row, i.e., memory module $230_{i+1}^{\,1}$ ($MM_{i+1}^{\,1}$), ..., $MM_{i+1}^{\,j}$, (i-2) intermediate rows, and a last row, i.e., memory module $230_N^{\,1}$ ($MM_N^{\,1}$), ..., $MM_N^{\,j}$. The BL region also includes a first column, i.e., ($MM_{i+1}^{\,1}$), ..., $MM_N^{\,1}$, (j-2) intermediate columns, and a last column, i.e., $MM_{i+1}^{\,j}$, ..., $MM_N^{\,j}$.

The TR region includes a first row, i.e., $MM_1^{\,j+1}$, ..., memory module $230_1^{\,M}$ ($MM_1^{\,M}$), (i-2) intermediate rows, and a last row, i.e., $MM_i^{\,j+1}$, ..., memory module $230_i^{\,M}$ ($MM_i^{\,M}$). The TR region also includes a first column, i.e., $MM_1^{\,j+1}$, ..., $MM_i^{\,j+1}$, (j-2) intermediate columns, and a last column, i.e., $MM_1^{\,M}$, ..., $MM_i^{\,M}$.

The BR region includes a first row, i.e., $MM_{i+1}^{\,j+1}$, ..., memory module $230_{i+1}^{\,M}$ ($MM_{i+1}^{\,M}$), (i-2) intermediate rows, and a last row, i.e., $MM_N^{\,j+1}$, ..., memory module $230_N^{\,M}$ ($MM_N^{\,M}$). The BR region also includes a first column, i.e., ($MM_{i+1}^{\,j+1}$), ..., $MM_N^{\,j+1}$, (j-2) intermediate columns, and a last column, i.e., $MM_{i+1}^{\,M}$, ..., $MM_N^{\,M}$.

In this embodiment, N equals 2·i and M equals 2·j.

For example, for the embodiment including 16 memory modules 230 arranged into 4 regions (i.e., 4 memory modules 230 per region), i and j equal 2, N and M equal 4, and there are no intermediate rows or intermediate columns in each region.

With respect to FIG. 2B, memory 200 includes, inter alia, an array 210 including backbone 220, branches 222, memory modules 230, as well as other components not depicted for clarity. Generally, array 210 has a width in a lateral direction, and a height in a longitudinal direction. Backbone 220 is a data, address and control signal bus that includes a primary portion and a number of secondary portions, while branches 222 extend the data, address and control signal bus of backbone 220 to support larger arrays 210. Backbone 220 and branches 220 generally divide array 210 into regions.

In many embodiments, the primary portion of backbone 220 is disposed in the lateral center of array 210 and extends in the longitudinal direction from the lower edge to the upper edge of array 210 (i.e., approximately the height of array 210), a first secondary portion of backbone 220 is disposed in the longitudinal center of array 210 and extends in a first lateral direction from the primary portion of backbone 220 to a left edge of array 210 (i.e., approximately 50% of the width of array 210), and a second secondary portion of backbone 220 is disposed in the longitudinal center of array 210 and extends in a second lateral direction from the primary portion of backbone 220 to a right edge of array 210 (i.e., approximately 50% of the width of array 210).

A first branch $222_1$ extends in the longitudinal direction from the center of the first secondary portion of backbone 220 to the upper edge of array 210 (i.e., approximately 50% of the height of array 210). A second branch $222_2$ extends in the longitudinal direction from the center of the first secondary portion of backbone 220 to the lower edge of array 210 (i.e., approximately 50% of the height of array 210). A third branch $222_3$ extends in the longitudinal direction from the center of the second secondary portion of backbone 220 to the upper edge of array 210 (i.e., approximately 50% of the height of array 210). A fourth branch $222_4$ extends in the longitudinal direction from the center of the second secondary portion of backbone 220 to the lower edge of array 210 (i.e., approximately 50% of the height of array 210).

In this embodiment, the primary and secondary portions of backbone 220, and branches $222_1$, $222_2$, $222_3$ and $222_4$, divide array 210 into eight regions, which, for convenience, are referred to as the first top left ($TL_1$) region, the second top left ($TL_2$) region, the first bottom left ($BL_1$) region, the second bottom left ($BL_2$) region, the first top right ($TR_1$) region, the second top right ($TR_2$) region, the first bottom right ($BR_1$) region, and the second bottom right ($BR_2$) region. Different numbers of regions and branches 222 are also supported, such as, for example, 4 branches 222 and 12 regions, 6 branches 222 and 16 regions, 8 branches 222 and 24 regions, etc., as well as additional secondary portions of backbone 220, such as 4 additional secondary portions of backbone 220 (for a total of 6 secondary portions), etc.

In many embodiments, branches 222 extend both the address bus and the data bus of backbone 220; in other embodiments, each branch 222 extends either the address bus or the data bus of backbone 220.

In this embodiment, array 210 includes a total number of memory modules 230, arranged in rows and columns, and, more particularly, arranged into eight regions i.e., $TL_1$, $TL_2$, $BL_1$, $BL_2$, $TR_1$, $TR_2$, $BR_1$ and $BR_2$. Each region is bordered by backbone 220 (at least on one side) and at least one of the branches 220 (on one side), and includes an equal number of memory modules 230 (i.e., 12.5% of the total number of memory modules 230) that are serviced by backbone 220 and branches 220.

Various numbers and arrangements of memory modules 230 are supported, such as, for example, 32 memory modules 230 arranged into 8 regions (i.e., 4 memory modules 230 per region), 64 memory modules 230 arranged into 8 regions (i.e., 8 memory modules 230 per region), 64 memory modules 230 arranged into 16 regions (i.e., 4 memory modules 230 per region), 128 memory modules 230 arranged into 8 regions (i.e., 16 memory modules 230 per region), 128 memory modules 230 arranged into 16 regions (i.e., 8 memory modules 230 per region), 128 memory modules 230 arranged into 32 regions (i.e., 4 memory modules 230 per region), etc.

Generally, each region includes "i" rows and "j" columns of memory modules 230. In many embodiments, "i" and "j" are the same (e.g., 2, 4, etc.), while in other embodiments, "i" and "j" may be different (e.g., "i" equals 2 and "j" equals 4, etc.).

The $TL_1$ region includes a first row, i.e., memory module $230_1^1$ ($MM_1^1$), ..., $MM_1^j$, (i-2) intermediate rows, and a last row, i.e., memory module $230_i^1$ ($MM_i^1$), ..., $MM_i^j$. The $TL_1$ also region includes a first column, i.e., $MM_1^1$, ..., $MM_i^1$, (j-2) intermediate columns, and a last column, i.e., $MM_1^j$, ..., $MM_i^j$. The $TL_2$ region includes a first row, i.e., $MM_1^{j+1}$, ..., $MM_1^k$, (i-2) intermediate rows, and a last row, i.e., $MM_i^{j+1}$, ..., $MM_i^k$. The $TL_2$ region also includes a first column, i.e., $MM_1^{j+1}$, ..., $MM_i^{j+1}$, (j-2) intermediate columns, and a last column, i.e., $MM_1^k$, ..., $MM_i^k$.

The $BL_1$ region includes a first row, i.e., memory module $230_{i+1}^1$ ($MM_{i+1}^1$), ..., $MM_{i+1}^j$, (i-2) intermediate rows, and a last row, i.e., memory module $230_N^1$ ($MM_N^1$), ..., $MM_N^j$. The $BL_1$ region also includes a first column, i.e., ($MM_i^1$), ..., $MM_N^1$, (j-2) intermediate columns, and a last column, i.e., $MM_{i+1}^j$, ..., $MM_N^j$. The $BL_2$ region includes a first row, i.e., $MM_{i+1}^{j+1}$, ..., $MM_{i+1}^k$, (i-2) intermediate rows, and a last row, i.e., $MM_N^{j+1}$, ..., $MM_N^k$. The $BL_2$ region also includes a first column, i.e., $MM_{i+1}^{j+1}$, ..., $MM_N^{j+1}$, (j-2) intermediate columns, and a last column, i.e., $MM_{i+1}^k$, ..., $MM_N^k$.

The $TR_1$ region includes a first row, i.e., $MM_1^{k+1}$, ..., $MM_1^l$, (i-2) intermediate rows, and a last row, i.e., $MM_i^{k+1}$, ..., $MM_i^l$. The $TR_1$ region also includes a first column, i.e., $MM_1^{k+1}$, ..., $MM_i^{k+1}$, (j-2) intermediate columns, and a last column, i.e., $MM_1^l$, ..., $MM_i^l$. The $TR_2$ region includes a first row, i.e., $MM_1^{l+1}$, ..., memory module $230_1^M$ ($MM_1^M$), and a last row, i.e., $MM_i^{l+1}$, ..., memory module $230_i^M$ ($MM_i^M$). The $TR_2$ region also includes a first column, i.e., $MM_1^{l+1}$, ..., $MM_i^{l+1}$, and a last column, i.e., $MM_1^M$, ..., $MM_i^M$.

The $BR_1$ region includes a first row, i.e., $MM_{i+1}^{k+1}$, ..., $MM_{i+1}^l$, (i-2) intermediate rows, and a last row, i.e., $MM_N^{k+1}$, ..., $MM_N^l$. The $BR_1$ region also includes a first column, i.e., $MM_{i+1}^{k+1}$, ..., $MM_N^{k+1}$, (j-2) intermediate columns, and a last column, i.e., $MM_{i+1}^l$, ..., $MM_N^l$. The $BR_2$ region includes a first row, i.e., $MM_{i+1}^{l+1}$, ..., memory module $230_{i+1}^M$ ($MM_{i+1}^M$), (i-2) intermediate rows, and a last row, i.e., $MM_N^{l+1}$, ..., memory module $230_N^M$ ($MM_N^M$). The $BR_2$ region also includes a first column, i.e., $MM_{i+1}^{l+1}$, ..., $MM_N^{l+1}$, (j-2) intermediate columns, and a last column, i.e., $MM_{i+1}^M$, ..., $MM_N^M$.

In this embodiment, N equals 2·i, k equals 2·j, l equals 3·j, and M equals 4·j.

Figure 3:
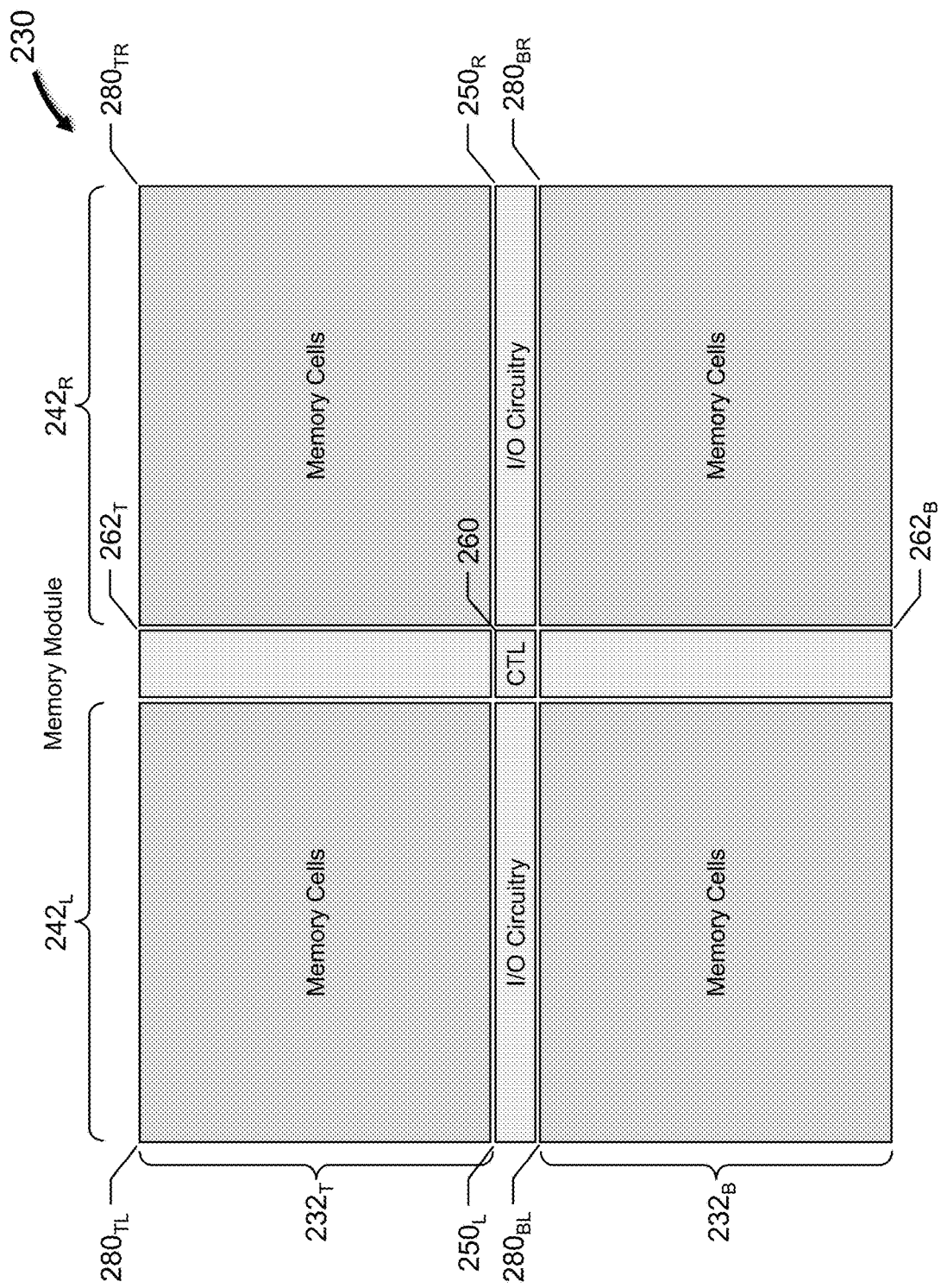
FIG. 3 depicts a block diagram of a memory module, in accordance with an embodiment of the present disclosure.

FIG. 3 depicts a block diagram of memory module 230, in accordance with an embodiment of the present disclosure.

Generally, a system cache module may include memory cells that are coupled to wordlines to form rows, and to bitline pairs to form columns. More particularly, each memory cell is coupled to one wordline and one bitline pair, and stores a single bit having a value of 0 or 1. In a simple cache memory architecture, the number of columns is equal to the word length, N, of the memory, and each row of memory cells stores one word by storing one bit of the word in each memory cell of the row. For example, a memory having a word length of 32 bits (i.e., 4 bytes) has 32 columns of memory cells. Generally, a system cache module reads (i.e., outputs) or writes (inputs) one word at a time.

For both reading and writing data, each word is identified by an address, which is an m-bit number that is decoded to provide the row number (i.e., wordline) along which the word is stored. For example, an 8-bit address encodes 256 rows, i.e., $M=2^8=256$. The address may be input to an address decoder via 8 individual bit or signal lines, as an 8-bit unsigned integer value, etc. The memory size is simply the number of addresses multiplied by the word length, such as, for example, 256 addresses·4 bytes/address=1,024 bytes.

Embodiments of the present disclosure provide a more sophisticated memory architecture in which the columns are arranged into a number of bitline groups in order to store more than one word along each row of the memory, and the bitline groups are organized into ways to store even more words along each row of the memory.

Memory module 230 includes I/O circuitry 250, control circuitry 260, wordline (WL) control circuitry 262, and memory regions 280. I/O circuitry 250 includes, inter alia, bitline precharge circuits, sense amplifiers, multiplexers, buffers, I/O data bus(es), etc. Control circuitry 260 is disposed in the center of memory module 230, and is coupled to I/O circuitry 250 as well as WL control circuitry 262. I/O circuitry 250 includes a first portion that extends in a first lateral direction from control circuitry 260 to a left edge, e.g., I/O circuitry 250, and a second portion that extends in a second lateral direction from control circuitry 260 to a right edge, e.g., I/O circuitry $250_R$. WL control circuitry 262 includes a first portion that extends in a first longitudinal direction from control circuitry 260 to a top edge, e.g., WL control circuitry $262_T$, and a second portion that extends in a second longitudinal direction from control circuitry 260 to a bottom edge, e.g., WL control circuitry $262_B$.

Generally, I/O circuitry 250 and WL control circuitry 262 divide the memory cells into a number of memory regions 280, e.g., memory regions $280_{TL}$, $280_{BL}$, $280_{TR}$, and $280_{BR}$, and each memory region 280 includes a number of memory cells that are coupled to wordlines 232 to form rows, and to bitline pairs 242 to form columns. More particularly, each memory cell is coupled to one wordline 232 and one bitline pair 242, and stores a single bit having a value of 0 or 1. Each memory region 280 has a number of wordlines 232 and a number of bitline pairs 242, i.e., memory region $280_{TL}$ includes wordlines $232_T$ and bitline pairs $242_L$, memory region $280_{BL}$ includes wordlines $232_B$ and bitline pairs $242_L$, memory region $280_{TR}$ includes wordlines $232_T$ and bitline pairs $242_R$, and memory region $280_{BR}$ includes wordlines $232_B$ and bitline pairs $242_R$.

As noted above, a cache memory may be divided into a number of ways, and the number of bitline groups, N, is equal to the number of ways multiplied by the word size. For example, N is equal to 32 for a 1-way cache with 32-bit words (N=1·32=32), N is equal to 256 for an 8-way cache with 32-bit words (N=8·32=256), etc. In many embodiments, the way number may be determined by the lower w-bits of the address, while the remaining bits are decoded to determine the wordline. For example, the lower 3 bits of the address determine the way number for an 8-way cache, (i.e., $2^3$=8). The number of columns in each group, C, is the same (e.g., 4), and each row stores N·C words. The particular word within each group of a selected way may be determined by the next c bits in the address, e.g., when C equals 4, the next 2 bits may be used to determine the word within the group (i.e., $2^2$=4). Other address decoding schemes are also supported. Alternatively, a separate burst read request, including, inter alia, a burst address signal to select which word or words are to be selectively read from each group of a selected way, may be provided.

A more detailed discussion of various embodiments of this memory architecture, including the unique burst read functionality, may be found in related U.S. patent application Ser. No. 17/885,709 (entitled "Burst Read With Flexible Burst Length for On-Chip Memory," filed concurrently herewith), the content of which is incorporated by reference herein in its entirety.

Figure 4A:
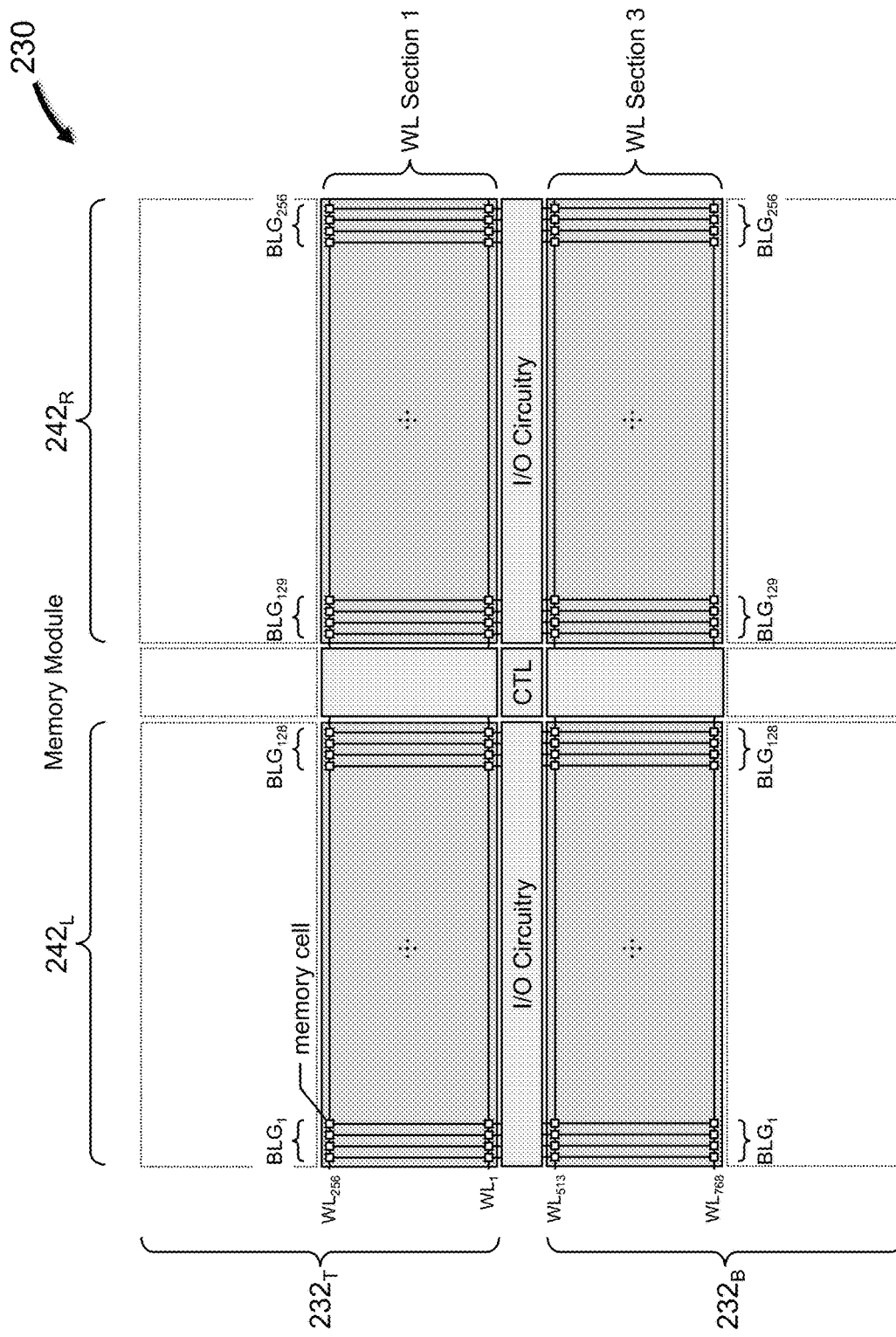
FIGS. 4A and 4B depict a memory module, in accordance with embodiments of the present disclosure.
Figure 4B:
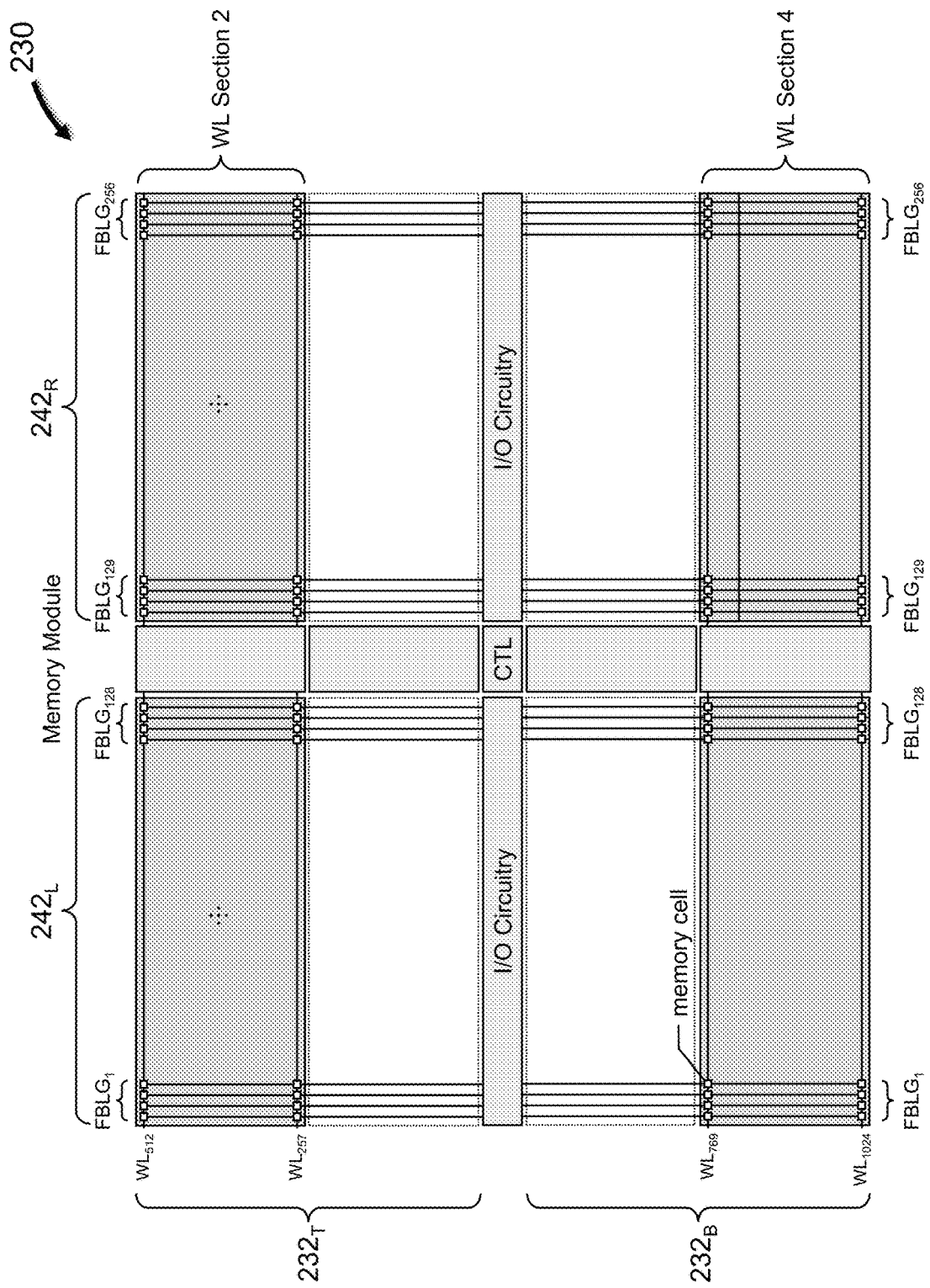

FIGS. 4A and 4B depict memory module 230, in accordance with embodiments of the present disclosure.

Wordlines $232_T$ have been divided into two sections, i.e., WL section 1 and WL section 2, and wordlines $232_B$ have been divided into two sections, i.e., WL section 3 and WL section 4. In this embodiment, each wordline section includes 256 wordlines, so memory module 230 includes a total of 1,024 wordlines (4·256=1,024).

WL control circuitry $262_T$ has been divided into WL control circuitry $262_1$ and WL control circuitry $262_2$, while WL control circuitry $262_B$ has been divided into WL control circuitry $262_3$ and WL control circuitry $262_4$. WL control circuitry $262_1$ controls WL section 1, WL control circuitry $262_2$ controls WL section 2, WL control circuitry $262_3$ controls WL section 3, and WL control circuitry $262_3$ controls WL section 4.

Bitline pairs 242L have been divided into 128 bitline groups (BLGs) and 128 flyover bitline groups (FBLGs), and each BLG and FBLG includes 4 columns, i.e., 4 bitline pairs. Similarly, bitline pairs 242R have been divided into 128 BLGs and 128 FBLGs, and each BLG and FBLG includes 4 columns, i.e., 4 bitline pairs. Flyover bitlines reduce capacitance for switch power and speed of access. Each wordline 232 is coupled to one memory cell in each column, and each memory cell is coupled to a single bitline pair, so each wordline is coupled to 1,024 memory cells (i.e., 256·4=1,024). Accordingly, memory module 230 stores 1 Mb of data (i.e., 1,024·256·4=1 Mb).

More particularly, WL section 1 includes wordlines $WL_1, \ldots, WL_{256}$ coupled to the memory cells within $BLG_1, \ldots, BLG_{256}$, WL section 2 includes wordlines $WL_{257}, \ldots, WL_{512}$ coupled to the memory cells within $FBLG_1, \ldots, FBLG_{256}$, WL section 3 includes wordlines $WL_{513}, \ldots, WL_{768}$ coupled to the memory cells within $BLG_1, \ldots, BLG_{256}$, and WL section 4 includes wordlines $WL_{769}, \ldots, WL_{1024}$ coupled to the memory cells within $FBLG_1, \ldots, FBLG_{256}$. For clarity, only certain WLs, BLGs and FBLGs have been labeled, and the associated memory cells are simply represented as a squares.

Figure 4C:
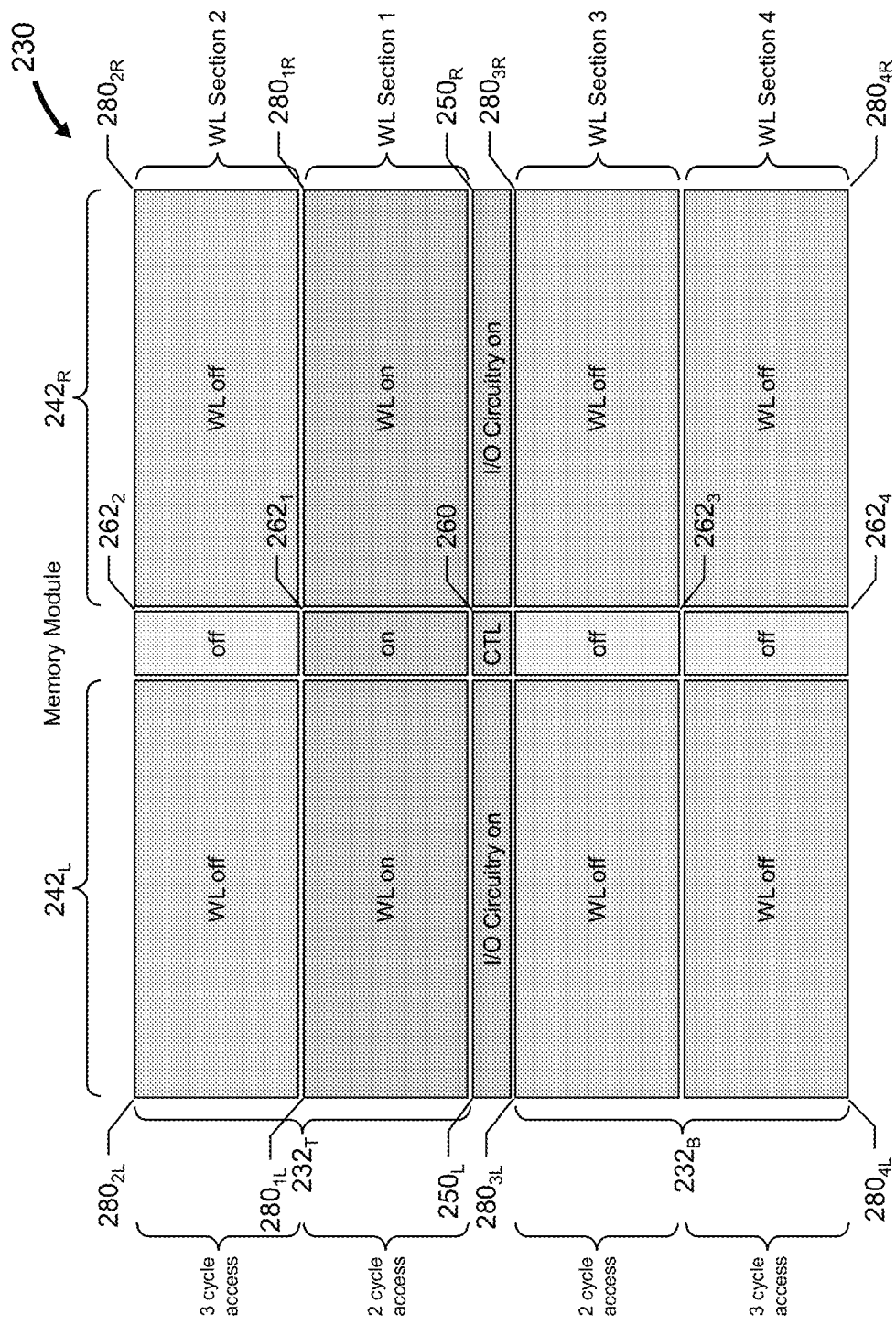
FIGS. 4C, 4D, 4E and 4F depict power states for a memory module, in accordance with embodiments of the present disclosure.

FIG. 4C depicts a power state for memory module 230, in accordance with embodiments of the present disclosure.

Rather than simply power up an entire memory module 230 in order to service read or write requests to one or more addresses associated with the memory module 230, embodiments of the present disclosure advantageously manage power to particular regions, sections and components based on these addresses. More particularly, in addition to I/O circuitry 250, control circuitry 260 powers up wordline control circuitry 262 for the particular wordline section with which the address is associated which saves a significant amount of power and reduces inrush current.

For illustration purposes, memory region $280_{TL}$ has been divided into memory regions $280_{1L}$ and $280_{2L}$, memory region $280_{BL}$ has been divided into memory regions $280_{3L}$ and $280_{4L}$, memory region $280_{TR}$ has been divided into memory regions $280_{1R}$ and $280_{2R}$, memory region $280_{BR}$ has been divided into memory regions $280_{3R}$ and $280_{4R}$. Wordline section 1 includes memory regions $280_{1L}$ and $280_{1R}$, wordline section 2 includes memory regions $280_{2L}$ and $280_{2R}$, wordline section 3 includes memory regions $280_{3L}$ and $280_{3R}$, and wordline section 4 includes memory regions $280_{4L}$ and $280_{4R}$.

In the example depicted in FIG. 4C, a read or write request has been received by memory module 230 that includes an address that decodes to a wordline within the range of WL1, . . . , WL256 in wordline section 1. In response, control circuitry 260 powers up I/O circuitry 250L and 250R (i.e., "I/O Circuitry on") and WL control circuitry 2621 (i.e., "on") which controls the wordlines within the range of WL1, . . . , WL256 (i.e., "WL on"). This process subjects the power supply for memory module 230 to the peak demand. In certain embodiments, control circuitry 260 may initially power up I/O circuitry $250_L$ and delay the power up of I/O circuitry $250_R$ to mitigate the peak demand.

Advantageously, the remaining 75% of wordlines 232 (i.e., the wordlines within WL sections 2, 3 and 4) and the remaining 50% of the bitline pairs (i.e., the bitline pairs within $FBLG_1, \ldots, FBLG_{256}$) are not powered up at this time, thereby saving a significant amount of power and reduces peak demand, inrush current, etc., compared to simply powering up the entirety of memory module 230.

Additionally, when a timely read or write request is received for an address that decodes to a wordline within the range of $WL_1, \ldots, WL_{256}$ in wordline section 1, I/O circuitry $250_L$ and $250_R$, the bitline pairs within $BLG_1, \ldots, BLG_{256}$ and WL control circuitry $262_1$ are already powered up, which improves latency when compared to an initial power up sequence.

In many embodiments, memory module 230 is powered down after a predetermined time after the read or write request has been serviced. Advantageously, control circuitry 260 automatically manages the power control for internal components of memory module 230, and no external commands, e.g., via I/O pins, are needed.

Embodiments of the present disclosure advantageously provide power up (and power down) sequences for all of the wordline sections of memory module 230.

Figure 4D:
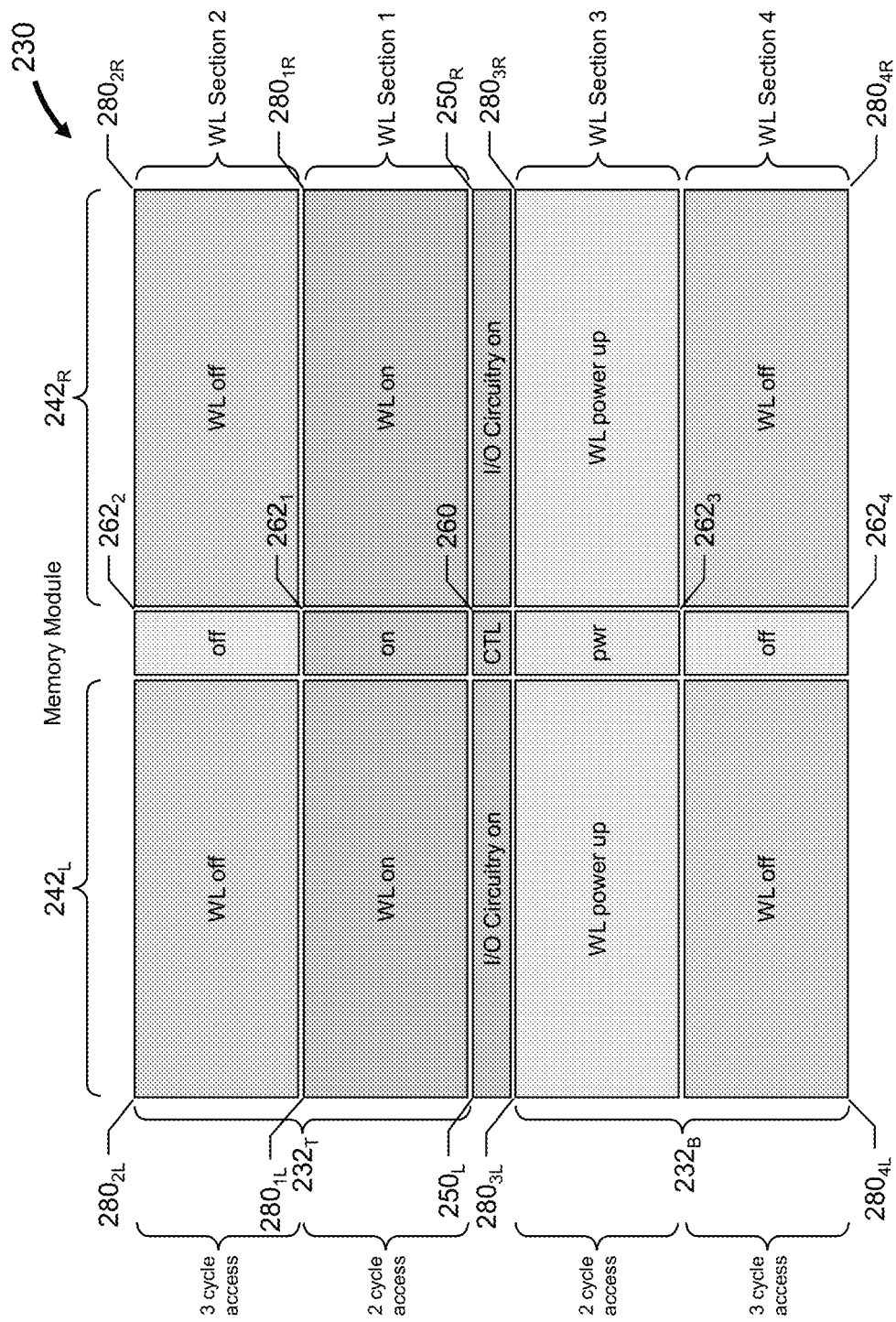
Figure 4E:
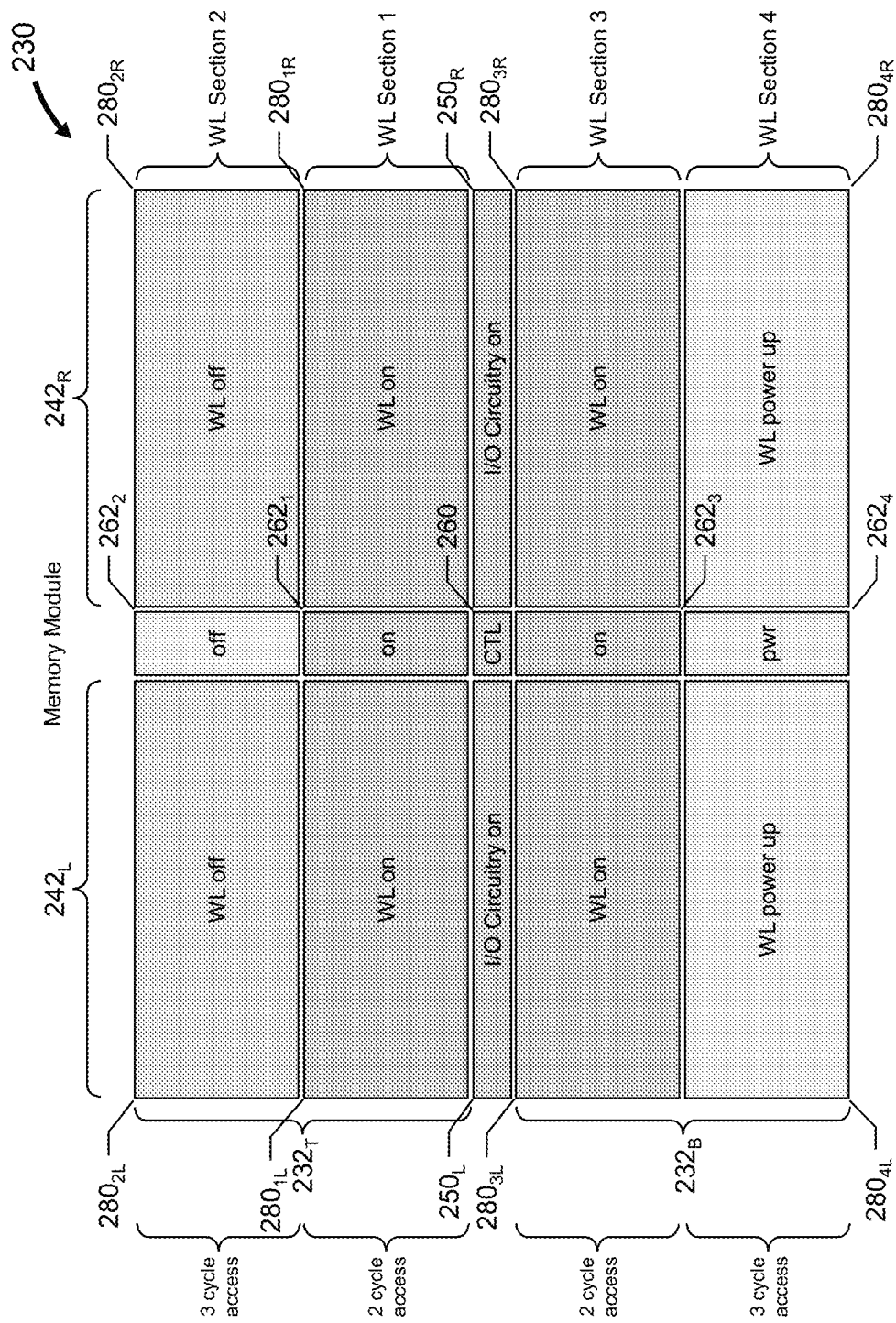
Figure 4F:
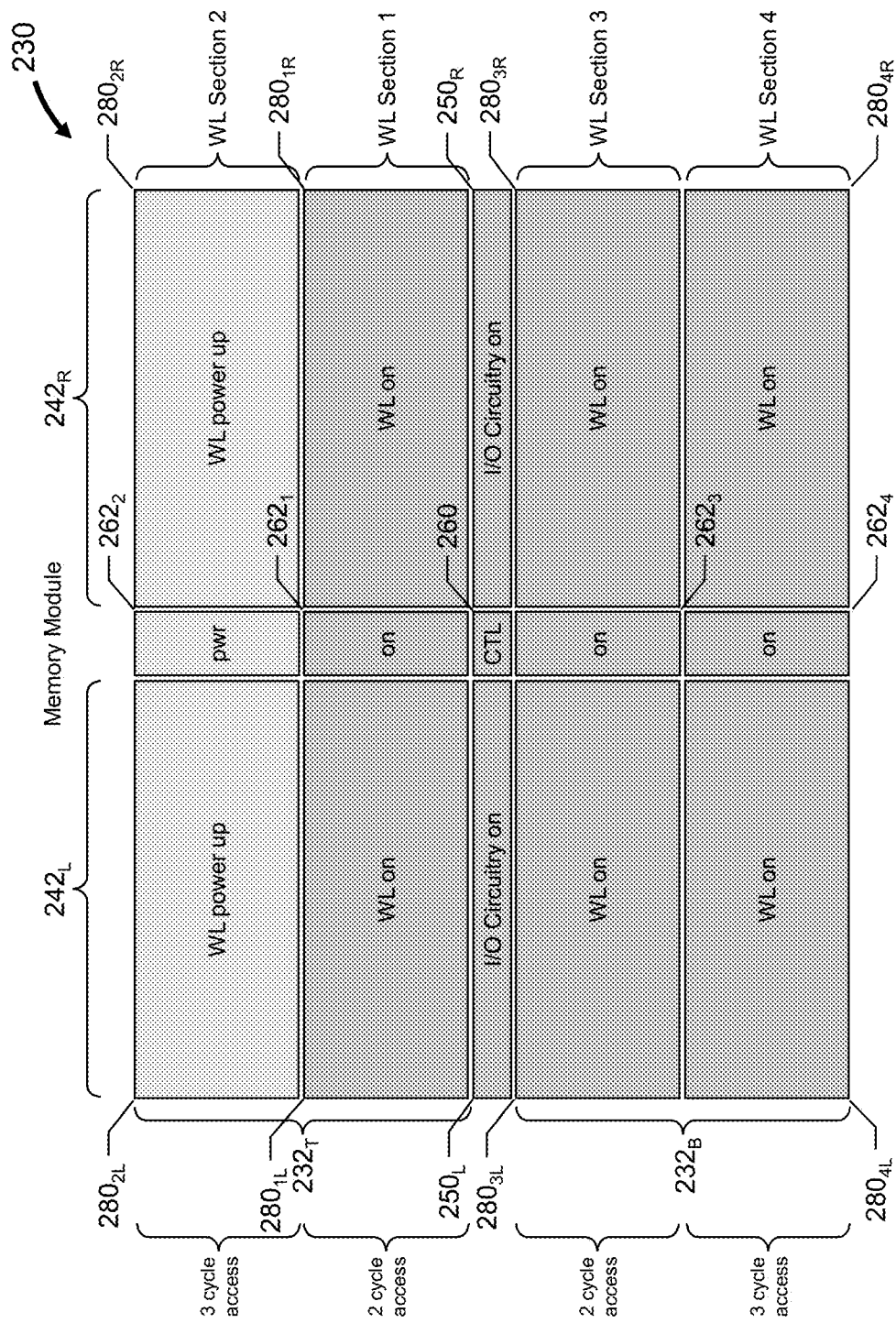

FIGS. 4D, 4E and 4F depict power states for memory module 230, in accordance with embodiments of the present disclosure.

While one or more sequential read or write requests to memory locations within wordline section 1 (i.e., memory regions $280_{1L}$ and $280_{1R}$) are being serviced, control circuitry 260 may power up the remaining wordline sections of memory module 230.

As depicted in FIG. 4D, control circuitry 260 powers up wordline section 3 (i.e., memory regions $280_{3L}$ and $280_{3R}$) while the read or write requests to memory locations within wordline section 1 are being serviced. More particularly, control circuitry 260 powers up WL control circuitry $262_3$ (i.e., "pwr") which controls the wordlines within the range of $WL_{513}, \ldots, WL_{768}$ (i.e., "WL power up"). Because wordline sections 1 and 3 share the same bitlines, i.e., $BLG_1, \ldots, BLG_{256}$, less power may be required, etc. In certain embodiments, the wordlines in wordline section 1 (i.e., $WL_1, \ldots, WL_{256}$) and wordline section 3 (i.e., $WL_{513}, \ldots, WL_{768}$) may be mapped to contiguous addresses.

As depicted in FIG. 4E, control circuitry 260 powers up wordline section 4 (i.e., memory regions $280_{4L}$ and $280_{4R}$) while the read or write requests to memory locations within wordline section 1 are being serviced. In certain embodiments, wordline sections 3 and 4 power up processes overlap at least for a period of time.

As depicted in FIG. 4F, control circuitry 260 powers up wordline section 3 (i.e., memory regions $280_{2L}$ and $280_{2R}$) while the read or write requests to memory locations within wordline section 1 are being serviced. In certain embodiments, power up for wordline sections 2 and 4, or for wordline sections 2, 3 and 4, may overlap in time.

Other wordline power on sequences are also supported.

Figure 5A:
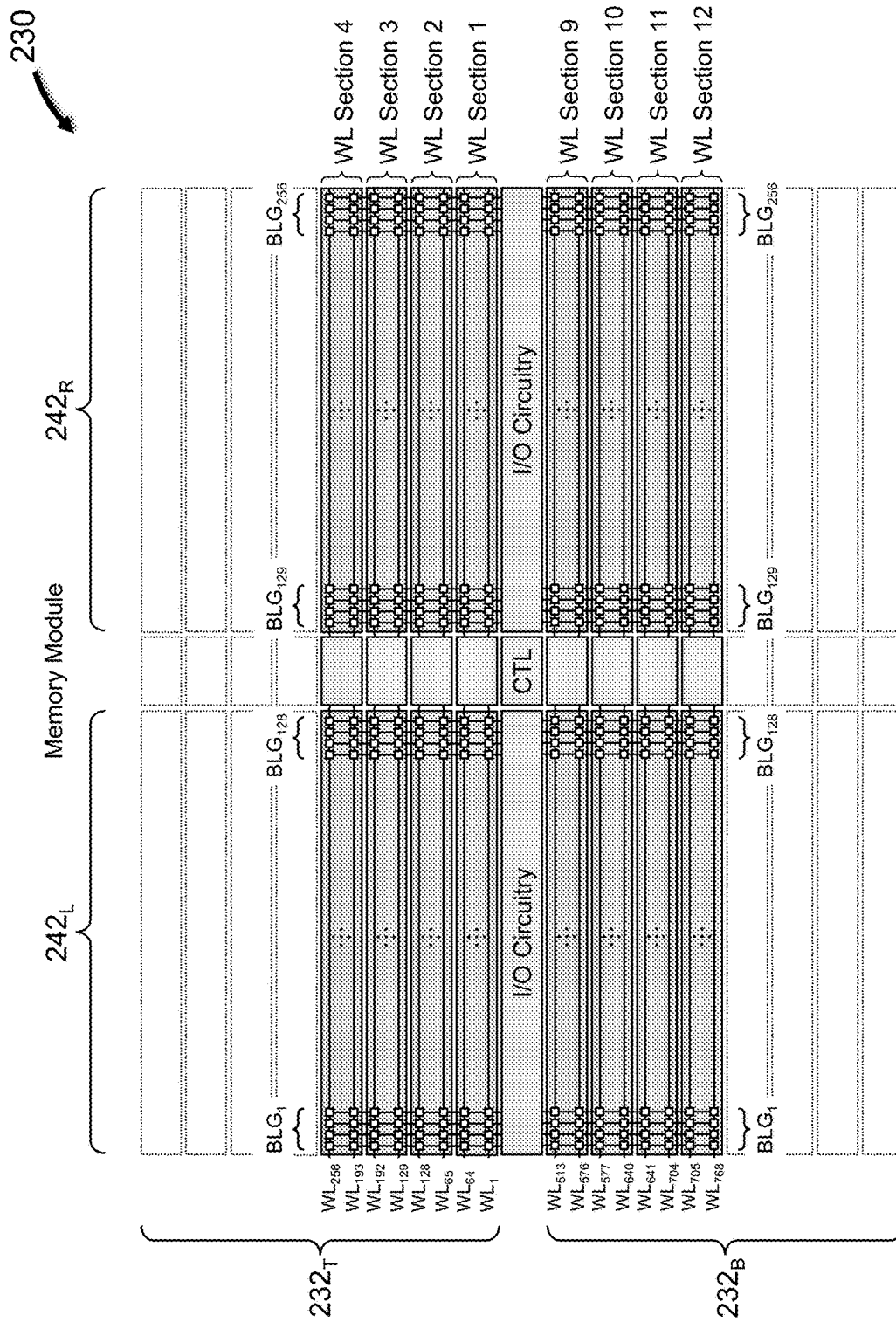
FIGS. 5A and 5B depict a memory module, in accordance with embodiments of the present disclosure.
Figure 5B:
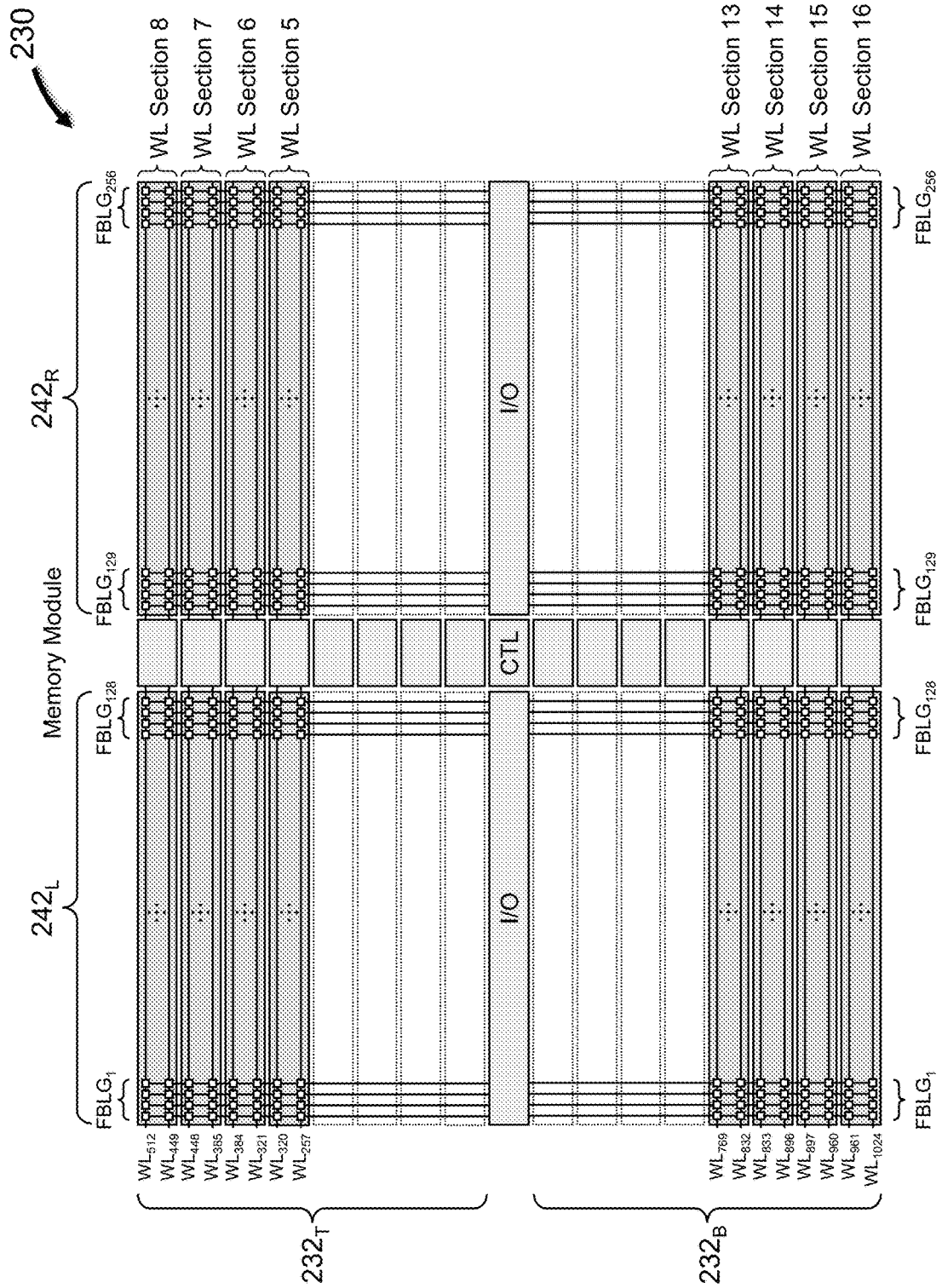

FIGS. 5A and 5B depict memory module 230, in accordance with embodiments of the present disclosure.

Wordlines $232_T$ have been divided into eight sections, i.e., WL sections 1 to 8, and wordlines $232_B$ have been divided into eight sections, i.e., WL sections 9 to 16. In this embodiment, each wordline section includes 64 wordlines, so memory module 230 includes a total of 1,024 wordlines (16·64=1,024).

WL control circuitry $262_T$ has been divided into WL control circuitry $262_1, \ldots, 262_8$, while WL control circuitry $262_B$ has been divided into WL control circuitry $262_9, \ldots, 262_{16}$. WL control circuitry $262_1$ controls WL section 1, WL control circuitry $262_2$ controls WL section 2, WL control circuitry $262_3$ controls WL section 3, and WL control circuitry $262_3$ controls WL section 4, WL control circuitry $262_5$ controls WL section 5, WL control circuitry $262_6$ controls WL section 6, WL control circuitry $262_7$ controls WL section 7, and WL control circuitry $262_8$ controls WL section 8. WL control circuitry $262_9$ controls WL section 9, WL control circuitry $262_{10}$ controls WL section 10, WL control circuitry $262_{11}$ controls WL section 11, WL control circuitry $262_{12}$ controls WL section 12, WL control circuitry $262_{13}$ controls WL section 13, WL control circuitry $262_{14}$ controls WL section 14, WL control circuitry $262_{15}$ controls WL section 15, and WL control circuitry $262_{16}$ controls WL section 16.

Bitline pairs 242L have been divided into 128 bitline groups (BLGs) and 128 flyover bitline groups (FBLGs), and each BLG and FBLG includes 4 columns, i.e., 4 bitline pairs. Similarly, bitline pairs 242R have been divided into 128 BLGs and 128 FBLGs, and each BLG and FBLG includes 4 columns, i.e., 4 bitline pairs. Each wordline 232 is coupled to one memory cell in each column, and each memory cell is coupled to a single bitline pair, so each wordline is coupled to 1,024 memory cells (i.e., 256·4=1,024). Accordingly, memory module 230 stores 1 Mb of data (i.e., 1,024·256·4=1 Mb).

More particularly, WL section 1 includes wordlines $WL_1, \ldots, WL_{64}$ coupled to the memory cells within $BLG_1, \ldots, BLG_{256}$, WL section 2 includes wordlines $WL_{65}, \ldots, WL_{128}$ coupled to the memory cells within $BLG_1, \ldots, BLG_{256}$, WL section 3 includes wordlines $WL_{129}, \ldots, WL_{192}$ coupled to the memory cells within $BLG_1, \ldots, BLG_{256}$, WL section 4 includes wordlines $WL_{193}, \ldots, WL_{256}$ coupled to the memory cells within $BLG_1, \ldots, BLG_{256}$, WL section 5 includes wordlines $WL_{257}, \ldots, WL_{320}$ coupled to the memory cells within $FBLG_1, \ldots, FBLG_{256}$, WL section 6 includes wordlines $WL_{321}, \ldots, WL_{384}$ coupled to the memory cells within $FBLG_1, \ldots, FBLG_{256}$, WL section 7 includes wordlines $WL_{385}, \ldots, WL_{448}$ coupled to the memory cells within $FBLG_1, \ldots, FBLG_{256}$, and WL section 8 includes wordlines $WL_{449}, \ldots, WL_{512}$ coupled to the memory cells within $FBLG_1, \ldots, FBLG_{256}$.

Similarly, WL section 9 includes wordlines $WL_{513}, \ldots, WL_{576}$ coupled to the memory cells within $BLG_1, \ldots, BLG_{256}$, WL section 10 includes wordlines $WL_{577}, \ldots, WL_{640}$ coupled to the memory cells within $BLG_1, \ldots, BLG_{256}$, WL section 11 includes wordlines $WL_{641}, \ldots, WL_{704}$ coupled to the memory cells within $BLG_1, \ldots, BLG_{256}$, WL section 12 includes wordlines $WL_{705}, \ldots, WL_{768}$ coupled to the memory cells within $BLG_1, \ldots, BLG_{256}$, WL section 13 includes wordlines $WL_{769}, \ldots, WL_{832}$ coupled to the memory cells within $FBLG_1, \ldots, FBLG_{256}$, WL section 14 includes wordlines $WL_{833}, \ldots, WL_{896}$ coupled to the memory cells within $FBLG_1, \ldots, FBLG_{256}$, WL section 15 includes wordlines $WL_{897}, \ldots, WL_{960}$ coupled to the memory cells within $FBLG_1, \ldots, FBLG_{256}$, and WL section 16 includes wordlines $WL_{961}, \ldots, WL_{1024}$ coupled to the memory cells within $FBLG_1, \ldots, FBLG_{256}$.

For clarity, only certain WLs, BLGs and FBLGs have been labeled, and the associated memory cells are simply represented as a squares.

Figure 5C:
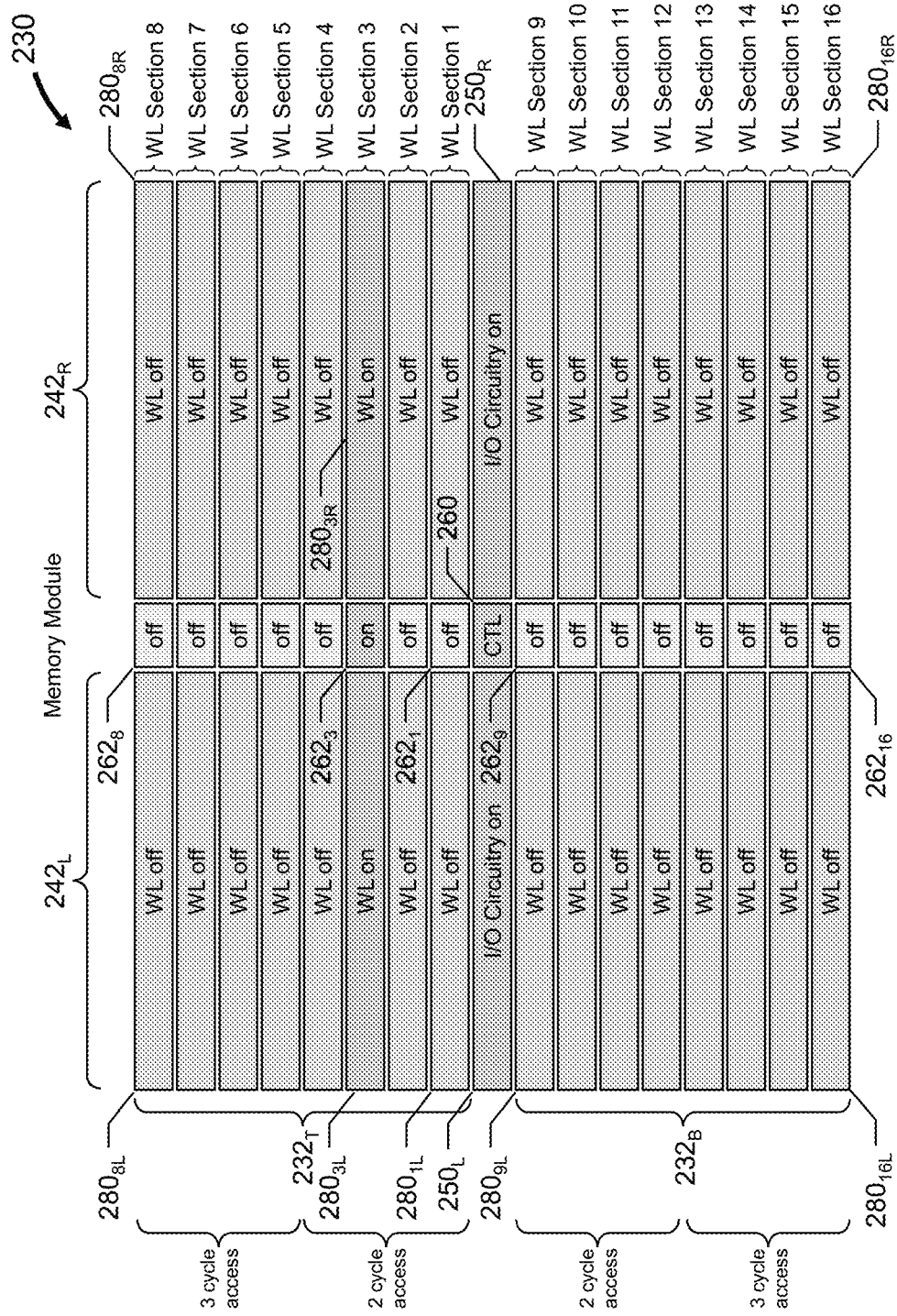
FIGS. 5C, 5D, 5E and 5F depict power states for a memory module, in accordance with embodiments of the present disclosure.

FIG. 5C depict a power status for memory module 230, in accordance with embodiments of the present disclosure.

Similar to the embodiment of memory module 230 depicted in FIG. 4C, rather than simply power up an entire memory module 230 in order to service read or write requests to one or more addresses associated with the memory module 230, embodiments of the present disclosure advantageously manage power to particular regions, sections and components based on these addresses. More particularly, in addition to I/O circuitry 250, control circuitry 260 powers up (and powers down) the particular wordline section with which the address is associated which saves a significant amount of power and reduces inrush current.

For illustration purposes, memory region $280_{TL}$ has been divided into memory regions $280_{1L}, \ldots, 280_{8L}$, memory region $280_{BL}$ has been divided into memory regions $280_{9L}, \ldots, 280_{16L}$, memory region $280_{TR}$ has been divided into memory regions $280_{1R}, \ldots, 280_{8R}$, memory region $280_{BR}$ has been divided into memory regions $280_{9R}, \ldots, 280_{16R}$.

Wordline section 1 includes memory regions $280_{1L}$ and $280_{1R}$, wordline section 2 includes memory regions $280_{2L}$ and $280_{2R}$, wordline section 3 includes memory regions $280_{3L}$ and $280_{3R}$, wordline section 4 includes memory regions $280_{4L}$ and $280_{4R}$, wordline section 5 includes memory regions $280_{5L}$ and $280_{5R}$, wordline section 6 includes memory regions $280_{6L}$ and $280_{6R}$, wordline section 7 includes memory regions $280_{7L}$ and $280_{7R}$, wordline section 8 includes memory regions $280_{8L}$ and $280_{8R}$, wordline section 9 includes memory regions $280_{9L}$ and $280_{9R}$, wordline section 10 includes memory regions $280_{10L}$ and $280_{10R}$, wordline section 11 includes memory regions $280_{11L}$ and $280_{11R}$, wordline section 12 includes memory regions $280_{12L}$ and $280_{12R}$, wordline section 13 includes memory regions $280_{13L}$ and $280_{13R}$, wordline section 14 includes memory regions $280_{14L}$ and $280_{14R}$, wordline section 15 includes memory regions $280_{15L}$ and $280_{15R}$, and wordline section 16 includes memory regions $280_{16L}$ and $280_{16R}$.

In the example depicted in FIG. 5C, a read or write request has been received by memory module 230 that includes an address that decodes to a wordline within the range of $WL_{129}, \ldots, WL_{192}$ in wordline section 3. In response, control circuitry 260 powers up I/O circuitry $250_L$ and $250_R$ (i.e., "I/O Circuitry on") and WL control circuitry $262_3$ (i.e., "on") which controls the wordlines within the range of $WL_{129}, \ldots, WL_{192}$ (i.e., "WL on"). This process subjects the power supply for memory module 230 to the peak demand. In certain embodiments, control circuitry 260 may initially power up I/O circuitry $250_L$ and delay the power up of I/O circuitry $250_L$ to mitigate the peak demand.

Advantageously, the remaining ~93% of wordlines 232 (i.e., the wordlines within WL sections 1, 2 and 4 to 16) are not powered up, thereby saving a significant amount of power compared to simply powering up the entirety of memory module 230.

Additionally, when a timely read or write request is received for an address that decodes to a wordline within the range of $WL_{129}, \ldots, WL_{192}$ in wordline section 3, I/O circuitry $250_L$ and $250_R$, and WL control circuitry $262_3$ associated with the wordlines within the range of $WL_{129}, \ldots, WL_{192}$ (i.e., "WL on") are already powered up, which improves latency when compared to an initial power up sequence.

In many embodiments, memory module 230 is powered down after a predetermined time after the read or write request has been serviced. Advantageously, control circuitry 260 automatically manages the power control for internal components of memory module 230, and no external commands, e.g., via I/O pins, are needed.

Embodiments of the present disclosure advantageously provide power up (and power down) sequences for all of the wordline sections of memory module 230.

Figure 5D:
Figure 5E:
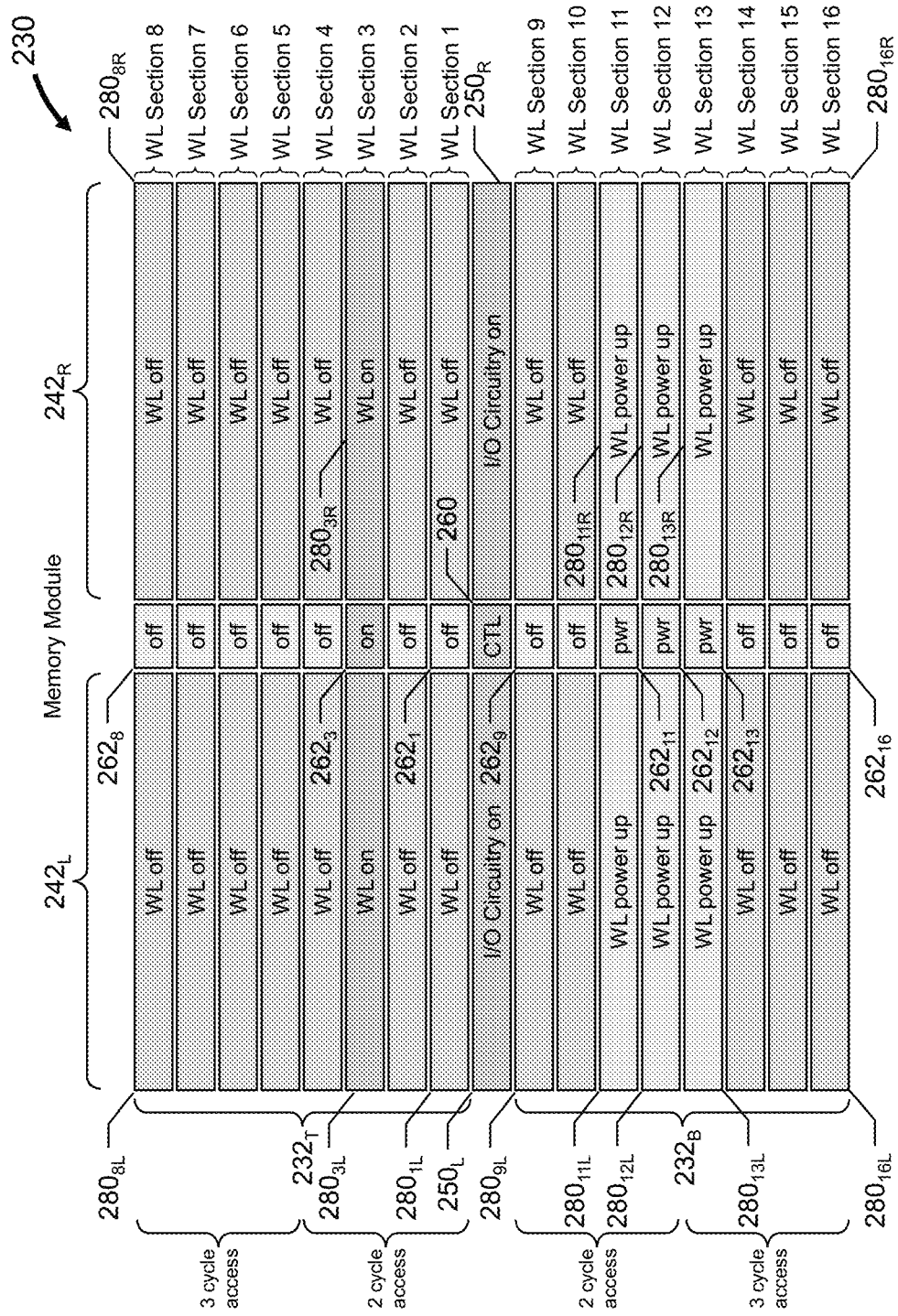
Figure 5F:
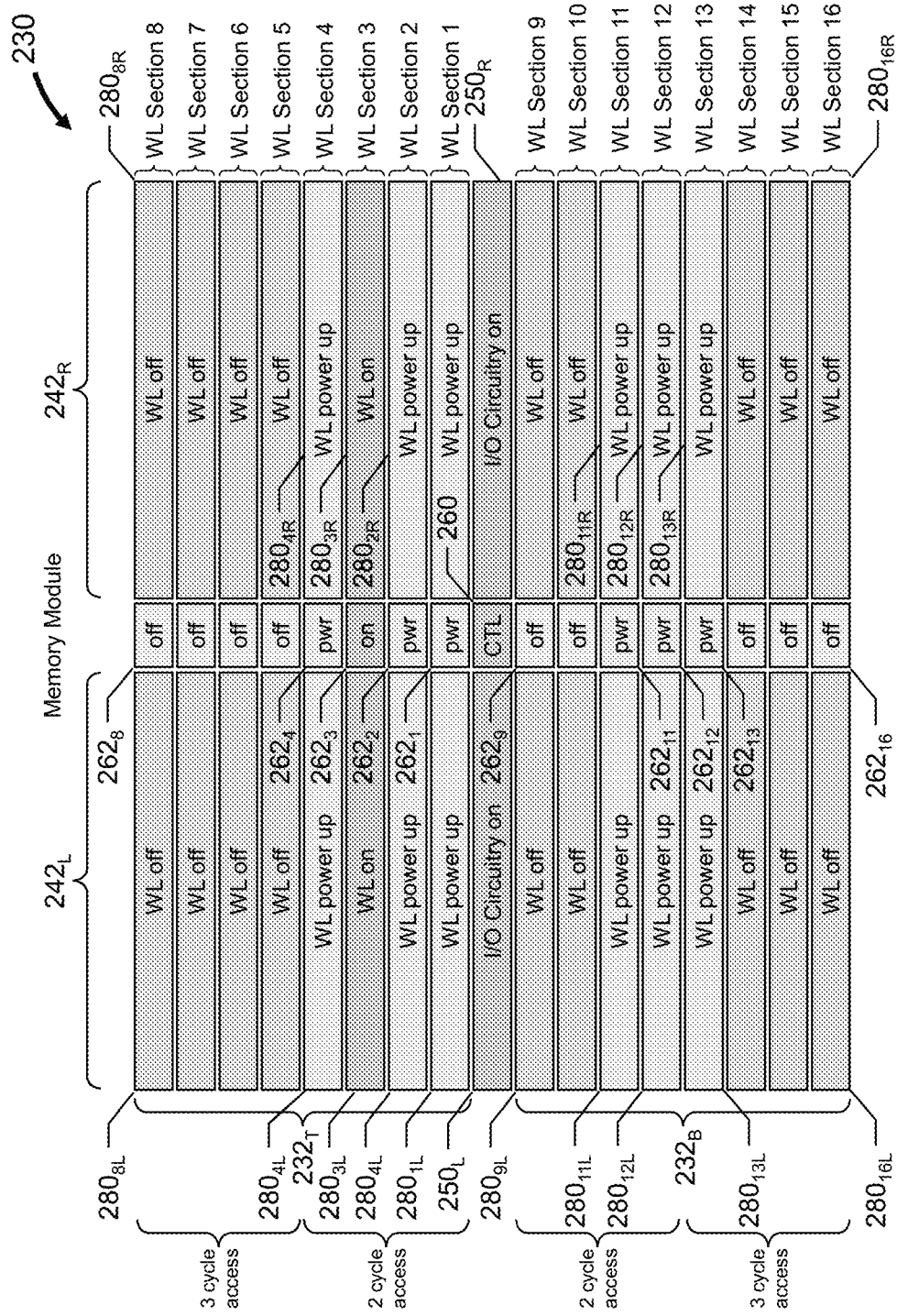

FIGS. 5D, 5E and 5F depict power states for memory module 230, in accordance with embodiments of the present disclosure.

While one or more sequential read or write requests to memory locations within wordline section 1 (i.e., memory regions $280_{1L}$ and $280_{1R}$) are being serviced, control circuitry 260 may power up certain wordline sections of memory module 230.

As depicted in FIG. 5D, control circuitry 260 powers up wordline section 12 while the read or write requests to memory locations within wordline section 3 are being serviced. More particularly, control circuitry 260 powers up WL control circuitry $262_{12}$ (i.e., "pwr") which controls the wordlines within the range of $WL_{705}, \ldots, WL_{768}$ (i.e., "WL power up"). Because wordline sections 3 and 12 share the same bitlines, i.e., $BLG_1, \ldots, BLG_{256}$, less power may be required, etc.

As depicted in FIG. 5E, control circuitry 260 powers up wordline sections 11 and 13 while the read or write requests to memory locations within wordline section 3 are being serviced. More particularly, control circuitry 260 powers up WL control circuitry $262_{11}$ (i.e., "pwr") which controls the wordlines within the range of $WL_{641}, \ldots, WL_{704}$ (i.e., "WL power up"). Because wordline sections 3, 11 and 12 share the same bitlines, i.e., $BLG_1, \ldots, BLG_{256}$, less power may be required, etc. Control circuitry 260 also powers up WL control circuitry $262_{13}$ (i.e., "pwr") which controls the wordlines within the range of $WL_{769}, \ldots, WL_{832}$ (i.e., "WL power up"). In certain embodiments, wordline sections 11, 12 and 13 power up processes overlap at least for a period of time.

As depicted in FIG. 5F, control circuitry 260 powers up wordline sections 1, 2 and 4 while the read or write requests to memory locations within wordline section 3 are being serviced. More particularly, control circuitry 260 powers up WL control circuitry $262_1$ (i.e., "pwr") which controls the wordlines within the range of $WL_1, \ldots, WL_{64}$ (i.e., "WL power up"), WL control circuitry $262_2$ (i.e., "pwr") which controls the wordlines within the range of $WL_{65}, \ldots, WL_{128}$ (i.e., "WL power up"), and WL control circuitry $262_4$ (i.e., "pwr") which controls the wordlines within the range of $WL_{193}, \ldots, WL_{256}$ (i.e., "WL power up"). Because wordline sections 1, 2, 3, 4, 11 and 12 share the same bitlines, i.e., $BLG_1, \ldots, BLG_{256}$, less power may be required, etc. In certain embodiments, wordline sections 1, 2 and 4 power up processes overlap at least for a period of time. In some embodiments, one or more wordline sections 1, 2, 4, 11, 12 and 13 power up processes may overlap at least for a period of time.

Other wordline power on sequences are also supported.

Figure 6A:
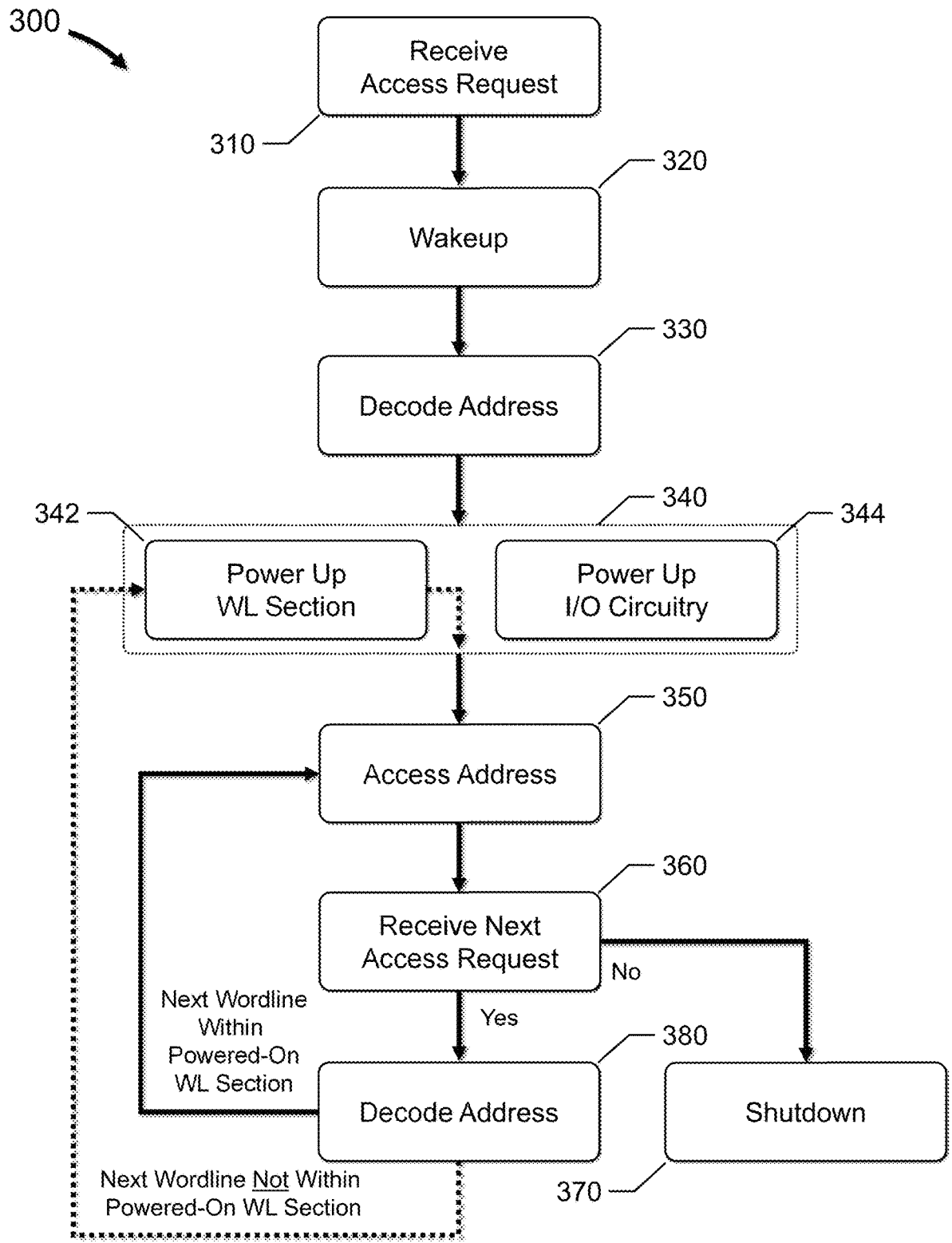
FIGS. 6A and 6B depict flow diagrams for managing the power of a memory module, in accordance with embodiments of the present disclosure.

FIG. 6A depicts flow diagram 300 for managing the power of memory module 230, in accordance with embodiments of the present disclosure.

In many embodiments, memory module 230 may receive two or more "back-to-back" access requests, i.e., read requests, write requests, etc. Generally, two access requests are considered to be "back-to-back" when the second access request is received before memory module 230 has finished processing the first access request, such as, for example, accessing the memory storage elements at the requested address.

At 310, an access request for memory module 230 is received. The access request includes at least an address. In many embodiments, prior to receiving the access request, power was not applied to wordline control circuitry 262, I/O circuitry 250 and control circuitry 260. In other words, memory module 230 was generally shut down and power was gated off for instances and logic, while the memory storage elements, i.e., the memory cells, were retaining their respective values.

At 320, power is applied to control circuitry 260, various internal power gates are turned on in anticipation of power up, etc. Generally, these activities may form a first, or wakeup, power stage.

At 330, the address is decoded by control circuitry 260. In many embodiments, decoding the address includes determining, based on the address, a wordline 232 of memory module 230, and determining, based on the wordline 232, a wordline section of memory module 230, such as, for example, wordline section 1, wordline section 3, etc.

At 340, power is applied to certain components of memory module 230. At 342, power is applied to the wordline control circuitry $262_1$ that is coupled to the wordline section determined at 330, such as, for example, wordline control circuitry $262_1$ for wordline section 1, wordline control circuitry $262_3$ for wordline section 3, etc. At 344, power is applied to I/O circuitry 250. Generally, the activities at 330 and 340 may form a second power stage.

At 350, the address is accessed. For example, a read request reads the memory cells at the address, a write request writes data (included the access request) to the memory cells at the address, etc.

At 360, when a next access request for memory module 230 is not received during the accessing of the memory cells at the address, flow proceeds to 370. And, when a next access request for memory module 230 is received during the accessing of the memory cells at the address, flow proceeds to 380.

At 370, power is removed from, inter alia, the wordline control circuitry $262_1$ that is coupled to the wordline section determined at 330, I/O circuitry 250, control circuitry 260, etc. In other words, memory module 230 is generally shutdown and power is gated off for instances and logic, while the memory storage elements, i.e., the memory cells, retain their respective values.

At 380, the next address is decoded by control circuitry 260. In many embodiments, decoding the next address includes determining, based on the next address, a next wordline 232 of memory module 230, and determining, based on the next wordline 232, a next wordline section of memory module 230, such as, for example, wordline section 2, wordline section 12, etc.

When the next wordline section is the same wordline section determined at 330, flow proceeds to 350, where the address is accessed, etc. When the next wordline section is not the same wordline section determined at 330, flow proceeds to 342, where power is applied to the wordline control circuitry 262 that is coupled to the next wordline section determined at 380, such as, for example, wordline control circuitry $262_2$ for wordline section 2, wordline control circuitry $262_4$ for wordline section 4, etc.

Figure 6B:
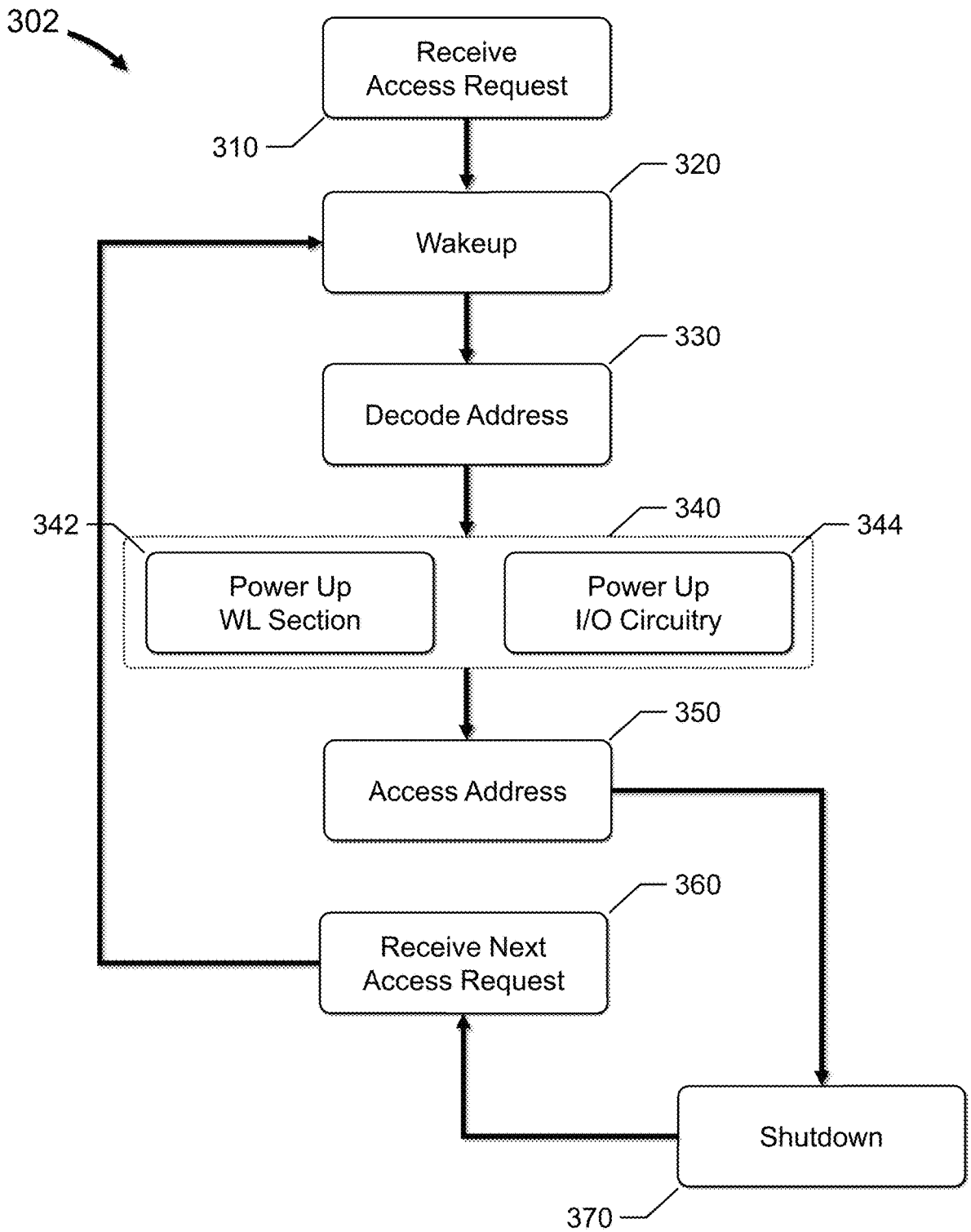

FIG. 6B depicts flow diagram 302 for managing the power of memory module 230, in accordance with embodiments of the present disclosure.

In many embodiments, memory module 230 may not receive "back-to-back" access requests, i.e., read requests, write requests, etc., as described above.

At 310, an access request for memory module 230 is received. The access request includes at least an address. In many embodiments, prior to receiving the access request, power was not applied to wordline control circuitry 262, I/O circuitry 250 and control circuitry 260. In other words, memory module 230 was generally shut down and power was gated off for instances and logic, while the memory storage elements, i.e., the memory cells, were retaining their respective values.

At 320, power is applied to control circuitry 260, various internal power gates are turned on in anticipation of power up, etc. Generally, these activities may form a first, or wakeup, power stage.

At 330, the address is decoded by control circuitry 260. In many embodiments, decoding the address includes determining, based on the address, a wordline 232 of memory module 230, and determining, based on the wordline 232, a wordline section of memory module 230, such as, for example, wordline section 1, wordline section 3, etc.

At 340, power is applied to certain components of memory module 230. At 342, power is applied to the wordline control circuitry $262_1$ that is coupled to the wordline section determined at 330, such as, for example, wordline control circuitry $262_1$ for wordline section 1, wordline control circuitry $262_3$ for wordline section 3, etc. At 344, power is applied to I/O circuitry 250. Generally, the activities at 330 and 340 may form a second power stage.

At 350, the address is accessed. For example, a read request reads the memory cells at the address, a write request writes data (included the access request) to the memory cells at the address, etc.

When a next access request for memory module 230 is not received during the accessing of the memory cells at the address, flow proceeds to 370.

At 370, power is removed from, inter alia, the wordline control circuitry $262_i$ that is coupled to the wordline section determined at 330, I/O circuitry 250, control circuitry 260, etc. In other words, memory module 230 is generally shutdown and power is gated off for instances and logic, while the memory storage elements, i.e., the memory cells, retain their respective values. Flow then proceeds to 360.

At 360, when a next access request for memory module 230 is received, flow proceeds to 320.

The embodiments described herein are combinable.

In one embodiment, a method for managing power in a memory includes receiving an access request for a memory, the access request including an address, the memory including a plurality of wordline sections, each wordline section including a number of wordlines; decoding the address, including determining, based on the address, an associated wordline, and determining, based on the associated wordline, an associated wordline section; applying power to wordline control circuitry coupled to the associated wordline section, each wordline section of the plurality of wordline sections being coupled to a different wordline control circuitry; and accessing the address.

In another embodiment, the method further includes, prior to said accessing the address, applying power to input/output (I/O) circuitry.

In another embodiment, the method further includes, prior to said decoding the address, applying power to control circuitry.

In another embodiment of the method, prior to said receiving the access request, power was not applied to the wordline control circuitry, the I/O circuitry and the control circuitry.

In another embodiment, the method further includes, when a next access request is not received during said accessing the address, removing power from the wordline control circuitry, the I/O circuitry and the control circuitry.

In another embodiment, the method further includes receiving, during said accessing the address, a next access request including a next address; decoding the next address, including determining, based on the next address, a next associated wordline of the memory, and determining, based on the next associated wordline, a next associated wordline section of the memory; and when the next associated wordline section is the associated wordline section, accessing the next address.

In another embodiment, the method further includes, when the next associated wordline section is not the associated wordline section, applying power to wordline control circuitry coupled to the next associated wordline section.

In another embodiment, the method further includes, when a further access request is not received during said accessing the next address, removing power from the wordline control circuitry, the I/O circuitry and the control circuitry.

In another embodiment of the method, the plurality of wordline sections includes at least four wordline sections, and each wordline section includes a same number of wordlines.

In another embodiment of the method, at least two wordline sections are coupled to a number of bitline groups, each bitline group including a number of bitline pairs; and at least two wordline sections are coupled to a number of flyover bitline groups, each flyover bitline group including a number of flyover bitline pairs.

In one embodiment, a memory includes a plurality of wordline sections, each wordline section including a number of wordlines, and each wordline section coupled to a different wordline control circuitry; and control circuitry, coupled to the wordline control circuitry and I/O circuitry, configured to in response to receiving an access request including an address, decode the address, including determine, based on the address, an associated wordline, and determine, based on the associated wordline, an associated wordline section, apply power to wordline control circuitry coupled to the associated wordline section, and access the address.

In another embodiment of the memory, the control circuitry is further configured to, prior to said access the address, apply power to the I/O circuitry.

In another embodiment of the memory, prior to said decode the address, power was applied to the control circuitry.

In another embodiment of the memory, prior to said receiving the access request, power was not applied to the wordline control circuitry, the I/O circuitry and the control circuitry.

In another embodiment of the memory, the control circuitry is further configured to when a next access request is not received during said access the address, remove power from the wordline control circuitry and the I/O circuitry.

In another embodiment of the memory, the control circuitry is further configured to receive, during said access the address, a next access request including a next address; decode the next address, including determine, based on the next address, a next associated wordline of the memory, and determine, based on the next associated wordline, a next associated wordline section of the memory; and when the next associated wordline section is the associated wordline section, access the next address.

In another embodiment of the memory, the control circuitry is further configured to when the next associated wordline section is not the associated wordline section, apply power to wordline control circuitry coupled to the next associated wordline section.

In another embodiment of the memory, the control circuitry is further configured to when a further access request is not received during said access the next address, remove power from the wordline control circuitry and the I/O circuitry.

In another embodiment of the memory, the plurality of wordline sections includes at least four wordline sections, and each wordline section includes a same number of wordlines; at least two wordline sections are coupled to a number of bitline groups, each bitline group including a number of bitline pairs; and at least two wordline sections are coupled to a number of flyover bitline groups, each flyover bitline group including a number of flyover bitline pairs.

In one embodiment, a system cache includes a plurality of memories as described above.

While implementations of the disclosure are susceptible to embodiment in many different forms, there is shown in the drawings and will herein be described in detail specific embodiments, with the understanding that the present disclosure is to be considered as an example of the principles of the disclosure and not intended to limit the disclosure to the specific embodiments shown and described. In the description above, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C." An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein.

The words "about," "approximately," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," "for example," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus, device, system, etc. may be used interchangeably in this text.

The many features and advantages of the disclosure are apparent from the detailed specification, and, thus, it is intended by the appended claims to cover all such features and advantages of the disclosure which fall within the scope of the disclosure. Further, since numerous modifications and variations will readily occur to those skilled in the art, it is not desired to limit the disclosure to the exact construction and operation illustrated and described, and, accordingly, all suitable modifications and equivalents may be resorted to that fall within the scope of the disclosure.

What is claimed is:

1. A method for managing power in a memory, comprising:
    receiving an access request for a memory, the access request including an address, the memory including a plurality of wordline sections, each wordline section including a number of wordlines;
    decoding the address, including:
        determining, based on the address, an associated wordline, and
        determining, based on the associated wordline, an associated wordline section;
    applying power to wordline control circuitry coupled to the associated wordline section, each wordline section of the plurality of wordline sections being coupled to a different wordline control circuitry; and
    accessing the address.

2. The method according to claim 1, further comprising, prior to said accessing the address, applying power to input/output (I/O) circuitry.

3. The method according to claim 2, further comprising, prior to said decoding the address, applying power to control circuitry.

4. The method according to claim 3, where, prior to said receiving the access request, power was not applied to the wordline control circuitry, the I/O circuitry and the control circuitry.

5. The method according to claim 4, further comprising:
    when a next access request is not received during said accessing the address, removing power from the wordline control circuitry, the I/O circuitry and the control circuitry.

6. The method according to claim 3, further comprising:
    receiving, during said accessing the address, a next access request including a next address;
    decoding the next address, including:
        determining, based on the next address, a next associated wordline of the memory, and
        determining, based on the next associated wordline, a next associated wordline section of the memory; and
    when the next associated wordline section is the associated wordline section, accessing the next address.

7. The method according to claim 6, further comprising:
    when the next associated wordline section is not the associated wordline section, applying power to wordline control circuitry coupled to the next associated wordline section.

8. The method according to claim 7, further comprising:
    when a further access request is not received during said accessing the next address, removing power from the wordline control circuitry, the I/O circuitry and the control circuitry.

9. The method according to claim 2, where the plurality of wordline sections includes at least four wordline sections, and each wordline section includes a same number of wordlines.

10. The method according to claim 9, where:
    at least two wordline sections are coupled to a number of bitline groups, each bitline group including a number of bitline pairs; and
    at least two wordline sections are coupled to a number of flyover bitline groups, each flyover bitline group including a number of flyover bitline pairs.

11. A memory, comprising:
    a plurality of wordline sections, each wordline section including a number of wordlines, and each wordline section coupled to a different wordline control circuitry; and
    control circuitry, coupled to the wordline control circuitry and input/output (I/O) circuitry, configured to:
        in response to receiving an access request including an address, decode the address, including:
            determine, based on the address, an associated wordline, and
            determine, based on the associated wordline, an associated wordline section,
        apply power to wordline control circuitry coupled to the associated wordline section, and
        access the address.

12. The memory according to claim 11, where the control circuitry is further configured to, prior to said access the address, apply power to the I/O circuitry.

13. The memory according to claim 12, where, prior to said decode the address, power was applied to the control circuitry.

14. The memory according to claim 13, where, prior to said receiving the access request, power was not applied to the wordline control circuitry, the I/O circuitry and the control circuitry.

15. The memory according to claim 14, where the control circuitry is further configured to:
    when a next access request is not received during said access the address, remove power from the wordline control circuitry and the I/O circuitry.

16. The memory according to claim 13, where the control circuitry is further configured to:
receive, during said access the address, a next access request including a next address;
decode the next address, including:
determine, based on the next address, a next associated wordline of the memory, and
determine, based on the next associated wordline, a next associated wordline section of the memory; and
when the next associated wordline section is the associated wordline section, access the next address.

17. The memory according to claim 16, where the control circuitry is further configured to:
when the next associated wordline section is not the associated wordline section, apply power to wordline control circuitry coupled to the next associated wordline section.

18. The memory according to claim 17, where the control circuitry is further configured to:
when a further access request is not received during said access the next address, remove power from the wordline control circuitry and the I/O circuitry.

19. The memory according to claim 11, where:
the plurality of wordline sections includes at least four wordline sections, and each wordline section includes a same number of wordlines;
at least two wordline sections are coupled to a number of bitline groups, each bitline group including a number of bitline pairs; and
at least two wordline sections are coupled to a number of flyover bitline groups, each flyover bitline group including a number of flyover bitline pairs.

20. A system cache comprising a plurality of memories, each memory according to claim 11.

* * * * *